United States Patent
Miura et al.

(10) Patent No.: US 10,103,314 B2
(45) Date of Patent: Oct. 16, 2018

(54) PIEZOELECTRIC MATERIAL, METHOD OF PRODUCING PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Kaoru Miura, Matsudo (JP); Miki Ueda, Tokyo (JP); Takayuki Watanabe, Yokohama (JP); Shunsuke Murakami, Sheffield (GB); Jumpei Hayashi, Yokohama (JP); Makoto Kubota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/563,899

(22) PCT Filed: Mar. 24, 2016

(86) PCT No.: PCT/JP2016/001723
§ 371 (c)(1),
(2) Date: Oct. 2, 2017

(87) PCT Pub. No.: WO2016/157854
PCT Pub. Date: Oct. 6, 2016

(65) Prior Publication Data
US 2018/0123019 A1  May 3, 2018

(30) Foreign Application Priority Data
Apr. 3, 2015  (JP) .................. 2015-077213

(51) Int. Cl.
*H01L 27/20* (2006.01)
*H01L 41/187* (2006.01)
(Continued)

(52) U.S. Cl.
CPC ...... *H01L 41/1873* (2013.01); *B41J 2/14274* (2013.01); *C04B 35/62695* (2013.01); *H01L 41/083* (2013.01)

(58) Field of Classification Search
CPC ..... H01L 27/20; H01L 41/00; H01L 41/0471; H01L 41/16; H01L 41/18; H01L 41/22
See application file for complete search history.

(56) References Cited

U.S. PATENT DOCUMENTS

2007/0126313 A1* 6/2007 Ueno ................ H03H 9/02031
310/311

FOREIGN PATENT DOCUMENTS

EP          1876156 A1    1/2008
JP       2009-227535 A   10/2009
(Continued)

OTHER PUBLICATIONS

Iwanami Dictionary of Physics and Chemistry, 5th Edition, Iwanami Shoten, Publishers, pp. 1268-1269.

*Primary Examiner* — Hoai V Pham
(74) *Attorney, Agent, or Firm* — Canon U.S.A. Inc. IP Division

(57) ABSTRACT

The piezoelectric material of the present invention includes a main component composed of a perovskite-type metal oxide represented by Formula (1), at least one of Mn and Ni, and Mg. The content of Ni is 0 mol or more and 0.05 mol or less based on 1 mol of the perovskite-type metal oxide, and the content of Mn is 0 mol or more and 0.005 mol or less based on 1 mol of the perovskite-type metal oxide, provided that the content of Mn and the content of Ni are not simultaneously 0 mol. The content of Mg is 0.001 mol or more and 0.020 mol or less based on 1 mol of the perovskite-type metal oxide.

(Continued)

Formula (1): $(Na_xBa_{1-y})(Nb_yTi_{1-y})O_3$ (where x is 0.83 or more and 0.95 or less, y is 0.85 or more and 0.95 or less, and x/y is 0.95 or more and 1.05 or less).

17 Claims, 14 Drawing Sheets

(51) Int. Cl.
*H01L 41/083* (2006.01)
*B41J 2/14* (2006.01)
*C04B 35/626* (2006.01)

(56) References Cited

FOREIGN PATENT DOCUMENTS

| | | |
|---|---|---|
| JP | 2014-062032 A | 4/2014 |
| WO | 2014/034694 A1 | 3/2014 |
| WO | 2015/115279 A1 | 8/2015 |

\* cited by examiner

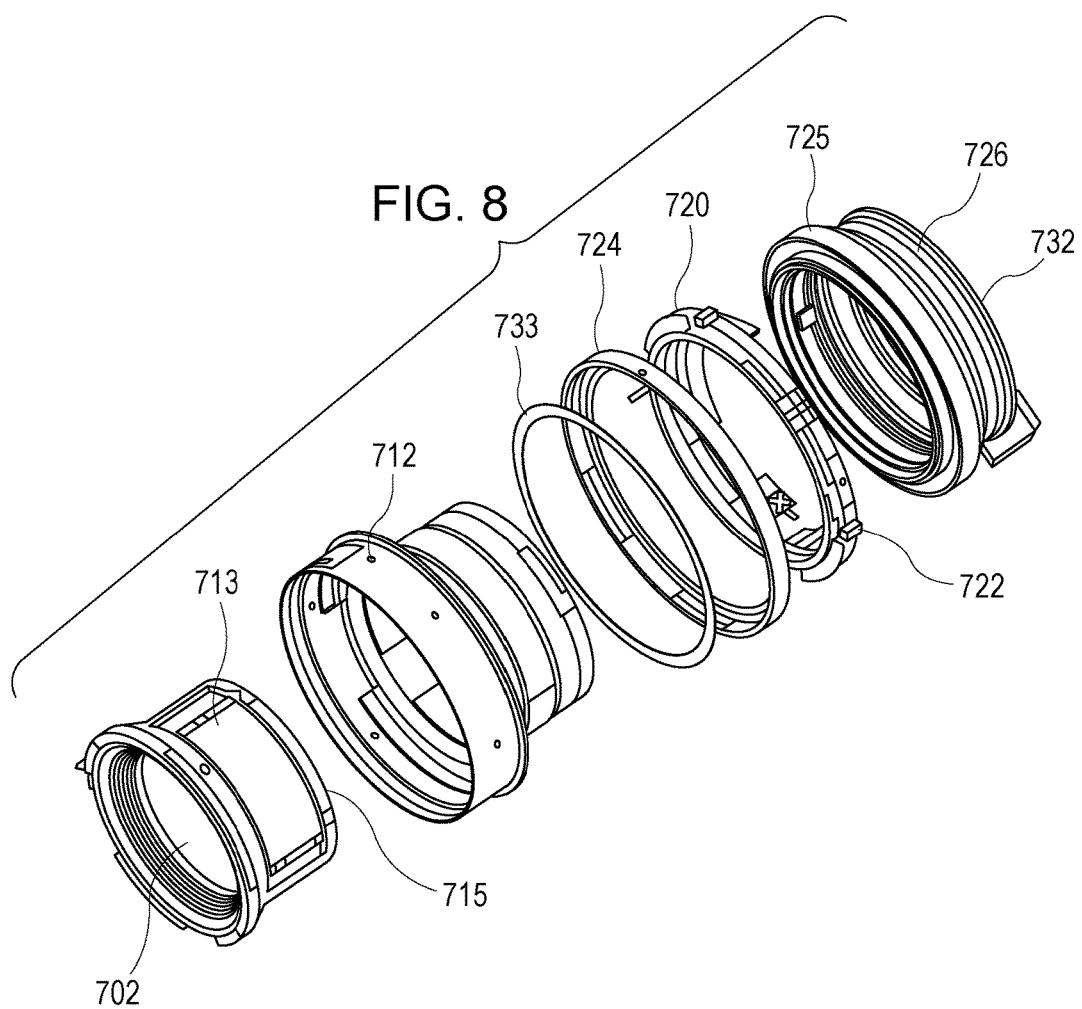

PIEZOELECTRIC MATERIAL, METHOD OF PRODUCING PIEZOELECTRIC MATERIAL, PIEZOELECTRIC ELEMENT, AND ELECTRONIC APPARATUS

CROSS-REFERENCE TO RELATED APPLICATIONS

This application is a National Stage filing of International Application No. PCT/JP2016/001723 filed Mar. 24, 2016, which claims the benefit of Japanese Patent Application No. 2015-077213, filed Apr. 3, 2015, the disclosures of each of which are hereby incorporated by reference herein in their entirety.

TECHNICAL FIELD

The present invention relates to a piezoelectric material, in particular, a lead-free piezoelectric material, and a method of producing the material. The present invention also relates to a piezoelectric element, a layered piezoelectric element, a method of producing the layered piezoelectric element, a liquid discharge head, a liquid discharge device, an ultrasonic motor, an optical apparatus, a vibratory device, a dust removing device, an image pickup device, and an electronic apparatus, including the piezoelectric material.

BACKGROUND ART

Piezoelectric materials are generally metal oxides having a perovskite-type structure called perovskite-type metal oxides ($ABO_3$). Lead zirconate titanate (hereinafter referred to as "PZT") containing lead is a typical piezoelectric material including a perovskite-type metal oxide and is used in a variety of piezoelectric devices, such as actuators, vibrators, sensors, and filters. However, PZT contains lead of which the influence on environment is viewed as a problem. Accordingly, there is a demand for a piezoelectric material not containing lead (hereinafter referred to as "lead-free piezoelectric material").

A solid solution of sodium niobate ($NaNbO_3$) and barium titanate ($BaTiO_3$) (hereinafter referred to as "NN-BT") is known as an example of the lead-free piezoelectric material. The NN-BT ceramic does not contain potassium causing sintering resistance and low moisture resistance and therefore hardly causes a change with time in piezoelectric properties. In addition, when the NN-BT ceramic is used in a piezoelectric device, phase transition of the crystal structure does not occur in the operation temperature range (for example, 0° C. to 80° C.) of the device, and therefore the performance does not significantly vary by the operating temperature.

Technologies relating to NN-BT ceramics are described in, for example, PTL 1 and PTL 2.

PTL 1 discloses that a high piezoelectric constant is achieved by adding cobalt oxide (CoO) to an NN-BT ceramic.

PTL 2 discloses that a high piezoelectric constant is achieved by adding at least one element selected from Mn and Ni to an NN-BT ceramic.

CITATION LIST

Patent Literature

PTL 1: Japanese Patent Laid-Open No. 2009-227535
PTL 2: Japanese Patent Laid-Open No. 2014-062032

SUMMARY OF INVENTION

Technical Problem

However, these known technologies have a difficulty in achieving compatibility between a high piezoelectric constant and a high mechanical quality factor ($Q_m$).

PTL 1 discloses that a composition (an NN-BT ceramic sample having a barium titanate concentration of 9% to 11%) having a relatively large piezoelectric constant $d_{31}$ of 54 to 56 pC/N as the absolute value has a low mechanical quality factor $Q_{11}$, value of 250 to 430. PTL 1 also discloses that addition of cobalt to NN-BT ceramic decreases the insulation resistance value to $10^6 \Omega$ or less.

PTL 2 discloses that a piezoelectric material composition having a large piezoelectric constant $d_{31}$ of 60 to 63 pC/N as the absolute value has a mechanical quality factor $Q_m$ of 300 to 350.

Based on the above, the present invention provides a piezoelectric material that does not contain lead, potassium, and cobalt and achieves compatibility between high piezoelectric properties and an appropriate mechanical quality factor. More specifically, the invention provides a piezoelectric material having a mechanical quality factor $Q_m$ of 500 or more while preventing a reduction in piezoelectric properties. The present invention also provides a piezoelectric element, a layered piezoelectric element, a method of producing the layered piezoelectric element, a liquid discharge head, a liquid discharge device, an ultrasonic motor, an optical apparatus, a vibratory device, a dust removing device, an image pickup device, and an electronic apparatus, including the piezoelectric material.

Solution to Problem

The piezoelectric material according to aspects of the present invention for solving the above-mentioned problems includes a main component containing a perovskite-type metal oxide represented by Formula (1); at least one selected from Ni and Mn; and Mg. The content of Ni is 0 mol or more and 0.05 mol or less based on 1 mol of the perovskite-type metal oxide, and the content of Mn is 0 mol or more and 0.005 mol or less based on 1 mol of the perovskite-type metal oxide, provided that the content of Mn and the content of Ni are not simultaneously 0 mol. The content of Mg is 0.001 mol or more and 0.020 mol or less based on 1 mol of the perovskite-type metal oxide.

Formula (1): $(Na_xBa_{1-y})(Nb_yTi_{1-y})O_3$ (where x is 0.83 or more and 0.95 or less, y is 0.85 or more and 0.95 or less, and x/y is 0.95 or more and 1.05 or less).

The method of producing a piezoelectric material according to an aspect of the present invention includes a step of firing a raw material powder at least containing Na, Nb, Ba, Ti, Mn, Ni, and Mg, wherein the molar ratio x/y of Na to Nb in the raw material powder is 0.95 or more and 1.05 or less.

The piezoelectric element according to an aspect of the present invention at least includes a first electrode, a piezoelectric material member, and a second electrode, wherein the piezoelectric material member is made of the piezoelectric material of the present invention.

The layered piezoelectric element according to an aspect of the present invention is composed of alternately stacked piezoelectric material layers and electrode layers including at least one internal electrode layer, wherein the piezoelectric material layers are made of the piezoelectric material of the present invention.

The liquid discharge head according to an aspect of the present invention at least includes a liquid chamber including a vibratory unit including the piezoelectric element or the layered piezoelectric element of the present invention and a discharge port communicating with the liquid chamber.

The liquid discharge device according to an aspect of the present invention includes a recording medium-conveying unit and the liquid discharge head of the present invention.

The ultrasonic motor according to an aspect of the present invention at least includes a vibratory component including the piezoelectric element or the layered piezoelectric element of the present invention and a movable component being in contact with the vibratory component.

The optical apparatus according to an aspect of the present invention includes a driving unit including the ultrasonic motor of the present invention.

The vibratory device according to an aspect of the present invention includes a vibratory component including the piezoelectric element or the layered piezoelectric element of the present invention.

The dust removing device according to an aspect of the present invention includes a vibratory unit provided with the vibratory device of the present invention.

The image pickup device according to an aspect of the present invention at least includes the dust removing device of the present invention and an image pickup element unit, wherein the vibratory member of the dust removing device is disposed on the light-receiving surface side of the image pickup element unit.

The electronic apparatus according to an aspect of the present invention includes a piezoelectric acoustic component including the piezoelectric element or the layered piezoelectric element of the present invention.

Further features of the present invention will become apparent from the following description of exemplary embodiments with reference to the attached drawings.

Advantageous Effects of Invention

The present invention can provide a piezoelectric material not containing lead, potassium, and cobalt and having a good mechanical quality factor and also good piezoelectric properties and a method of producing the piezoelectric material. The present invention can also provide a piezoelectric element, a layered piezoelectric element, a liquid discharge head, a liquid discharge device, an ultrasonic motor, an optical apparatus, a vibratory device, a dust removing device, an image pickup device, and an electronic apparatus, including the piezoelectric material.

Since the piezoelectric material of the present invention does not contain lead, its load on the environment is low. The piezoelectric material also does not contain potassium and therefore has excellent sinterability and moisture resistance.

BRIEF DESCRIPTION OF DRAWINGS

FIG. 8 is a schematic diagram illustrating an embodiment of an optical apparatus of the present invention.

DESCRIPTION OF EMBODIMENTS

Figure 1:
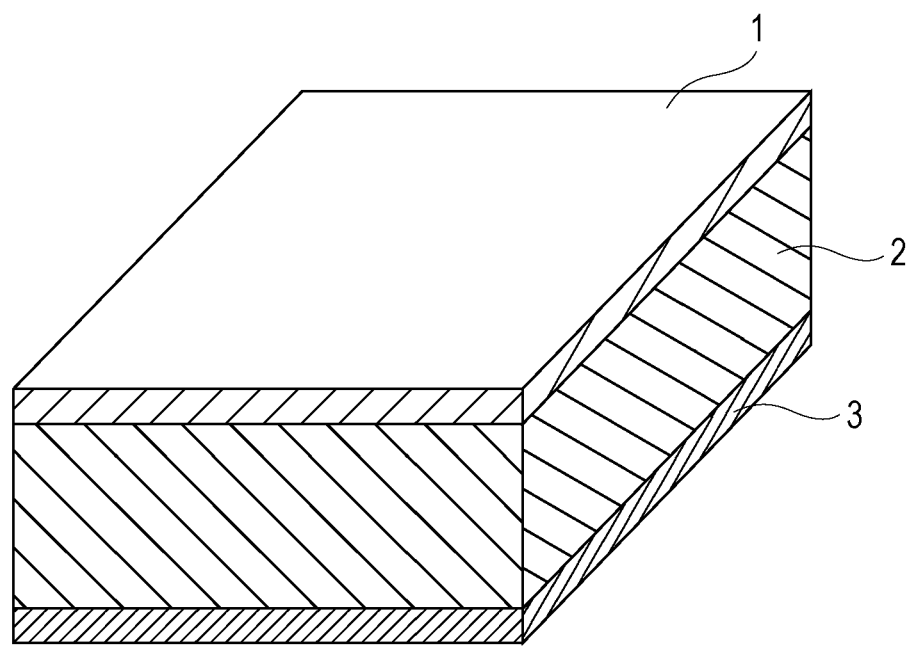
FIG. 1 is a schematic diagram illustrating an embodiment of the configuration of a piezoelectric element of the present invention.

Embodiments of the present invention will now be described.

The present invention provides a lead-free piezoelectric material having an NN-BT basic constitution and having good mechanical quality factor and piezoelectricity. The piezoelectric material of the present invention can be applied to various uses, such as a capacitor, a memory, and a sensor, by utilizing the characteristics as a dielectric.

The piezoelectric material of the present invention includes a main component containing a perovskite-type metal oxide represented by Formula (1); at least one selected from a Ni component and a Mn component; and a Mg component. The content of Ni of the Ni component is 0 mol or more and 0.05 mol or less based on 1 mol of the perovskite-type metal oxide, and the content of Mn of the Mn component is 0 mol or more and 0.005 mol or less based on 1 mol of the perovskite-type metal oxide, provided that the contents of Mn and Ni are not simultaneously 0 mol. The content of Mg of the Mg component is 0.001 mol or more and 0.020 mol or less based on 1 mol of the perovskite-type metal oxide.

Formula (1): $(Na_xBa_{1-y})(Nb_yTi_{1-y})O_3$ (where x is 0.83 or more and 0.95 or less, y is 0.85 or more and 0.95 or less, and x/y is 0.95 or more and 1.05 or less).

The term "main component" of a piezoelectric material refers to the majority component for expressing the piezoelectric properties among the various components constituting the piezoelectric material. The molar ratio of the majority component is 51% or more in the piezoelectric material.

The term "piezoelectric material not containing lead, potassium, and cobalt (lead-free, potassium-free, and cobalt-free)" means that the contents of these components are each 0 ppm or more and less than 1000 ppm based on 1 mol of the piezoelectric material.

In the present invention, the perovskite-type metal oxide refers to a metal oxide having a perovskite-type structure, which is ideally a cubic crystal structure, as described in Iwanami Dictionary of Physics and Chemistry, 5th Edition (Iwanami Shoten, Published on Feb. 20, 1998). A metal oxide having a perovskite-type structure is generally expressed by a chemical formula: $ABO_3$. In the perovskite-type metal oxide, elements A and B occupy specific unit cell positions called A site and B site, respectively, in the ion forms. For example, in a cubic crystal unit cell, the element A is placed at the vertexes of the cubic, and the element B is placed at the body-centered position of the cubic. The element O occupies the face-centered positions of the cubic as anions of oxygen. The A site element is 12-fold coordinated, and the B site element is 6-fold coordinated. Slight coordinate shifts of the A element, B element, and O element from the symmetry sites of the respective unit cells distort the unit cells of the perovskite-type structure into, for example, a tetragonal, rhombohedral, or orthorhombic crystal system.

In the metal oxide represented by Formula (1), the metal elements positioned at the A site are Na and Ba, and the metal elements positioned at the B site are Ti and Nb. However, a part of Na and Ba atoms may be positioned at the B site. Similarly, a part of Ti and Nb atoms may be positioned at the A site.

The molar ratio of the elements on the B site to the element O in Formula (1) is 1:3, but the ratio of the amounts of the elements may slightly shift (for example, from 1.00: 2.94 to 1.00:3.06) as long as the perovskite-type structure is the primary phase of the metal oxide. Such a case is also encompassed in the scope of the present invention. The perovskite-type structure of the metal oxide can be confirmed by structural analysis, such as X-ray diffraction or electron beam diffraction.

The compound represented by Formula (1) can also be expressed as a perovskite-type metal oxide containing "y" mol of $Na_{x/y}NbO_3$ and "1-y" of $BaTiO_3$. Furthermore, when the value of x and the value of y are almost equal, i.e., the value of x/y is almost 1, the perovskite-type metal oxide represented by Formula (1) can be regarded as a solid solution of sodium niobate ($NaNbO_3$) and barium titanate ($BaTiO_3$).

In such a solid solution, the molar ratio (Na/Nb) of Na to Nb in the solid solution may become larger than 1 depending on the composition of the raw material powder or weighing of the raw material powder. The acceptable upper limit of the molar ratio (Na/Nb) is 1.05.

In contrast, Na may volatilize during the step of pre-firing or main-firing. As a result, the Na/Nb ratio may be smaller than 1. In the piezoelectric material of the present invention, based on that there is a case of an excess or deficit of Na to Nb, the molar ratio of Na is expressed by a subscript "x" for being distinguished from the molar ratio of Nb expressed by a subscript "y". Accordingly, the piezoelectric material is expressed by Formula (1): $(Na_xBa_{1-y})(Nb_yTi_{1-y})O_3$. Hereinafter, the descriptions are based on this expression.

A piezoelectric material has a temperature (Curie temperature), the piezoelectricity of the piezoelectric material being lost at the temperature or more. Throughout the specification, the Curie temperature refers to the temperature showing a maximum dielectric constant in the vicinity of the phase transition temperature between the ferroelectric phase and the paraelectric phase in the piezoelectric material. The Curie temperature may be measured by any known procedure.

The molar ratio x of sodium (Na) in the compound represented by Formula (1) is 0.83 or more and 0.95 or less. A molar ratio x of Na of less than 0.83 reduces the Curie temperature to less than 120° C., whereas a molar ratio x of Na of higher than 0.95 reduces the piezoelectricity.

In Formula (1), a molar ratio x of less than 0.83 causes a deficit of Na to Nb, leading to occurrence of an impurity phase (a phase having an X-ray diffraction pattern similar to that of, for example, $Ba_4Nb_2O_9$, $Ba_6Ti_7Nb_9O_{42}$, $Ba_3Nb_4Ti_4O_{21}$, or $Ba_3Nb_{32}Ti_5O_{21}$). A metal oxide sample containing a large impurity phase has a low resistivity of $10^7$ to $10^8$ Ωcm and has a difficulty in polarization treatment.

The molar ratio y of niobium (Nb) in the compound represented by Formula (1) is 0.85 or more and 0.95 or less. A molar ratio y of Nb of less than 0.85 on the B site may reduce the Curie temperature to less than 120° C., whereas a molar ratio y of higher than 0.95 reduces the piezoelectricity. Accordingly, in a molar ratio y in a range of 0.85 or more and 0.95 or less, the Curie temperature is in a range of about 120° C. to 310° C. to provide high piezoelectricity. Furthermore, in a molar ratio y in a range of 0.88 or more and 0.90 or less, the Curie temperature is in a range of about 190° C. to 230° C. to decrease the risk of a reduction in piezoelectric performance due to heat in the device production step.

The ratio x/y of the molar ratio x of sodium to the molar ratio y of niobium in Formula (1) is in a range of 0.95 or more and 1.05 or less. A composition in which the deficit of sodium to niobium is larger than 5% causes an impurity phase (a phase having an X-ray diffraction pattern similar to that of, for example, $Ba_4Nb_2O_9$, $Ba_6Ti_7Nb_9O_{42}$, $Ba_3Nb_4Ti_4O_{21}$, or $Ba_3Nb_{32}Ti_5O_{21}$) to reduce the piezoelectric constant. A composition in which the excess of sodium to niobium is larger than 5% reduces the mechanical quality factor or reduces the insulation properties. A ratio x/y of the molar ratio x of sodium to the molar ratio y of niobium in a range of 0.95 or more and 1.05 or less can prevent occurrence of an impurity phase to provide high insulation properties and, in particular, high piezoelectricity. The ratio x/y further can be 0.97 or more and 1.00 or less.

The perovskite-type metal oxide represented by Formula (1) contains at least one selected from a Ni component and a Mn component; and a Mg component. Therefore, the piezoelectric material of the present invention can also be represented by Formula (2): $(Na_xBa_{1-y})(Nb_yTi_{1-y})O_3$-z(NiO)-w($MnO_2$)-α(MgO).

The values of the parameters in Formula (2) are as follows: The parameter x is 0.83 or more and 0.95 or less; the parameter y is 0.85 or more and 0.95 or less;

parameter x/y is 0.95 or more and 1.05 or less; the parameter z is 0 or more and 0.05 or less; the parameter w is 0 or more and 0.005 or less; the parameter a is 0.001 or more and 0.02 or less; and the value of z+w is larger than 0.

In Formula (2), the molar ratio z of the Ni component is 0 or more and 0.05 or less; the molar ratio w of the Mn component is 0 or more and 0.005 or less; and the value of z+w is larger than 0. Although Ni and Mn are shown in the forms of NiO and $MnO_2$, respectively, in Formula (2) for convenience, each of the Ni component and the Mn component in the piezoelectric material of the present invention may be in any existential state.

The piezoelectric material of the present invention containing 0.5 mol % or less of Mn (the molar ratio w is 0.005 or less) can have enhanced resistivity, piezoelectric constant, and density, compared to a piezoelectric material not containing Mn at all. However, a piezoelectric material containing more than 0.5 mol % of Mn (the molar ratio w is larger than 0.005) may have a reduced resistivity.

The piezoelectric material of the present invention containing 5 mol % or less of Ni (the molar ratio z is 0.05 or less) can have enhanced resistivity, piezoelectric constant, and density, compared to a piezoelectric material not containing Ni at all. However, a piezoelectric material containing more than 5 mol % of Ni (the molar ratio z is larger than 0.05) may cause occurrence of an impurity phase to reduce the piezoelectricity. A piezoelectric material of the present invention containing 5 mol % or less of Ni (the molar ratio z is 0.05 or less) can reduce the sintering temperature. The sintering temperature is the lowest firing temperature necessary for preparing a sintered compact having a relative density of 95% or more.

In Formula (2), the molar ratio α of Mg is 0.001 or more and 0.02 or less.

Although Mg is shown in the form of MgO for convenience, Mg in the piezoelectric material of the present invention may be in any existential state.

The piezoelectric material of the present invention containing 0.1 mol % or more and 2.0 mol % or less of Mg (the molar ratio α is 0.001 or more and 0.02 or less) can increase the mechanical quality factor without reducing the piezoelectric constant. However, a piezoelectric material containing more than 2.0 mol % of Mg (the molar ratio α is larger than 0.02) has reduced piezoelectricity, whereas an amount of Mg of less than 0.1 mol % (the molar ratio α is less than 0.001) cannot provide an effect of increasing the mechanical quality factor.

Ni, Mn, and Mg may be present at the A site (12-fold coordination), the B site (6-fold coordination), or both of the perovskite structure or may be present at the grain boundaries of the ceramic. The distribution and the occupation site in crystals of Ni, Mn, and Mg can be evaluated by, for example, electron microscopic observation, energy dispersive X-ray spectrometry, X-ray diffractometry, Raman scattering, or transmission electron microscopic observation.

A part of Mg atoms can occupy the B site. Replacement of the B site with Mg generates an internal electric field in the ceramic after polarization, prevents the domain wall from vibrating due to an external electric field, and increases the mechanical quality factor.

The internal electric field can be evaluated by measuring the hysteresis loop of polarization-electric field. The measured hysteresis loop reveals the coercive electric field (+Ec) when the spontaneous polarization is reversed from negative to positive and the coercive electric field (−Ec) when the spontaneous polarization is reversed from positive to negative. The intensities of +Ec and −Ec are the same in the absence of an internal electric field. In the presence of an internal electric field, the center of the hysteresis loop shifts in the x-axis (electric field axis) direction. The intensity of the internal electric field is the average of the values of +Ec and −Ec. The hysteresis loop can be measured with a commercially available ferroelectric evaluation apparatus. In general, in measurement of a hysteresis loop, an AC electric field of positive and negative triangular or sine waves is applied to a sample. The hysteresis loop is modified by software for centering and is displayed such that the average value of polarization quantities when the positive and negative maximum electric fields are applied is positioned at the zero point of the y-axis.

Mg can be present at the grain boundaries. The localization of a part of the Mg atoms at the grain boundaries prevents formation of pores, leading to an increase in the mechanical quality factor. In addition, the presence of a part of the Mg atoms at the grain boundaries reduces the grain-boundary friction and hardens the material.

The piezoelectric material of the present invention must be prevented from being depolarized by heat in the device production step or heat generation during driving of the device. To do this, the piezoelectric material of the present invention can have a composition having a Curie temperature of 120° C. or more, preferably 125° C. or more, and more preferably 130° C. or more. The Curie temperature of the piezoelectric material of the present invention can be controlled by the composition parameters x and y, the contents of Ni, Mn, and Mg, and a micro-scale compositional homogeneity of the piezoelectric material.

In crystals containing sodium niobate as a component, Na may evaporate or diffuse during sintering, leading to a deficiency of Na relative to Nb in the composition of a sample after sintering. That is, a defect occurs on the A site. However, if a raw material powder contains an excessive amount of a Na raw material, the sintered compact may have reduced insulation properties. Accordingly, raw materials can be intentionally weighed such that Na is deficient relative to Nb within a range of 5% or less.

In order to readily produce the piezoelectric material of the present invention or to adjust the physical properties of the piezoelectric material of the present invention, a part of the Ba atoms may be replaced with a bivalent metal element, such as Sr or Ca. Similarly, a part of the Nb atoms may be replaced with a pentavalent metal element, such as Ta, within a range of 20 mol % or less. Similarly, a part of the Ti atoms may be replaced with Zr or Sn within a range of 20 mol % or less, and a part of the Na atoms may be replaced with Li within a range of 15 mol % or less. In addition, replacement with other elements also does not deteriorate the characteristics of the piezoelectric material of the present invention as long as the replacement amount is 0.1 mol % or less based on the amount of Ba or Nb in Formula (1) or (2).

In order to prepare a piezoelectric ceramic, which is an embodiment of the piezoelectric material of the present invention, a green compact before firing is produced. Herein, the term "ceramic" refers to aggregate (also referred to as bulk body) of crystal grains having a base component of a metal oxide and fired by heat treatment, a so-called polycrystal, and encompasses those processed after sintering. The green compact is a solid prepared by molding the raw material powder, in particular, having a higher purity. Examples of the molding method include uniaxial pressing, cold hydrostatic pressing, hot hydrostatic pressing, casting, and extrusion. The green compact can be produced from a granulated powder. Sintering of the green compact produced from a granulated powder has an advantage that the size distribution of the crystal grains of the sintered compact can be readily uniformized.

The raw material powder of the piezoelectric material may be granulated by any method. In particular, spray drying can be employed from the viewpoint of providing a granulated powder with a more uniform grain diameter.

Examples of the binder that can be used in granulation include polyvinyl alcohol (PVA), polyvinyl butyral (PVB), and acrylic resins. The amount of the binder to be used in granulation can be 1 to 10 parts by weight based on the weight of the raw material powder of the piezoelectric material and can be 2 to 5 parts by weight from the viewpoint of increasing the density of the green compact.

The green compact may be sintered by any method.

Examples of the sintering include sintering in an electric furnace, sintering in a gas furnace, electrical heating, microwave sintering, millimeter-wave sintering, and hot isostatic pressing (HIP). The electric furnace or the gas furnace for sintering may be a continuous furnace or a batch furnace.

The sintering may be performed at any temperature, and a temperature allowing each compound to react and being sufficient for crystal growth can be particularly employed. From the viewpoint of controlling the grain diameter of the piezoelectric material in a range of 0.3 to 100 µm, the sintering temperature can be 1050° C. or more and 1300° C. or less, in particular, 1100° C. or more and 1200° C. or less. The piezoelectric material sintered in such a temperature range shows satisfactory piezoelectric performance. In order to stably reproduce the properties of piezoelectric materials prepared by sintering, the sintering is performed at a constant temperature within the above-mentioned range for 2 to 48 hours. Although sintering such as two-stage sintering may be employed, a method that does not involve a rapid temperature change can be employed in light of productivity.

The piezoelectric material prepared by sintering is polished and can then be heated at a temperature of the Curie temperature or more. Although the mechanical polishing generates a residual stress inside the piezoelectric material, the heat treatment at the Curie temperature or more relieves the residual stress to further enhance the piezoelectric properties of the piezoelectric material. The heat treatment may be performed for any period of time, for example, 1 hour or more.

If a piezoelectric material of the present invention has a crystal grain diameter of larger than 100 µm, the strength of the piezoelectric material may be insufficient for undergoing cutting processing and polishing processing. In contrast, a grain diameter of smaller than 0.3 µm decreases the piezoelectricity. Accordingly, regarding the grain diameter range, the average grain diameter can be 0.3 µm or more and 100 µm or less, in particular, 0.5 µm or more and 70 µm or less.

The present invention relates to a piezoelectric material, which may be in any form, such as a powder other than a ceramic, a single crystal, a film, or slurry.

When the piezoelectric material of the present invention is used as a film formed on a substrate, the piezoelectric material can have a thickness of 200 nm or more and 10 µm or less, in particular, 300 nm or more and 3 µm or less. A piezoelectric material having a thickness of 200 nm or more and 10 µm or less can provide an electromechanical conversion function sufficient as a piezoelectric element.

The film may be stacked by any process. For example, chemical solution deposition (CSD), a sol-gel method, metal organic chemical vapor deposition (MOCVD), sputtering, pulsed laser deposition (PLD), hydrothermal synthesis, or aerosol deposition (AD) can be employed. In particular, chemical solution deposition or sputtering can be employed. Chemical solution deposition or sputtering can readily form a film having a large area. The substrate on which the piezoelectric material of the present invention is formed can be a single-crystal substrate cut and polished along the (001) plane or (110) plane. The use of a single-crystal substrate cut and polished along a specific crystal plane can strongly orient the piezoelectric material film formed on the surface of the substrate in the same direction.

(Piezoelectric Element)

The piezoelectric element of the present invention will now be described.

FIG. 1 is a schematic diagram illustrating an embodiment of the configuration of a piezoelectric element of the present invention. The piezoelectric element according to the present invention at least includes a first electrode 1, a piezoelectric material member 2, and a second electrode 3. The piezoelectric material constituting the piezoelectric material member 2 is the piezoelectric material of the present invention.

The piezoelectric properties of the piezoelectric material according to the present invention can be evaluated by producing a piezoelectric element at least having a first electrode and a second electrode. The first and the second electrodes are conductive layers having a thickness of about 5 nm to 10 µm. Each electrode may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof.

The first and the second electrodes may be each made of any of these materials or may be each a multilayer made of two or more of these materials. The first and the second electrodes may be made of different materials.

The first and the second electrodes may be produced by any method and may be formed by, for example, baking of a metal paste, or sputtering or vapor deposition. The first and the second electrodes may be each patterned into a desired shape.

(Polarization)

In the piezoelectric element, the polarization axes can be aligned in the same direction. A piezoelectric element having polarization axes aligned in the same direction has an enhanced piezoelectric constant.

The piezoelectric element may be polarized by any method. The polarization treatment may be performed in the atmosphere or in a silicone oil. The temperature for the polarization can be 60° C. to 150° C. The optimum conditions for the polarization slightly vary depending on the composition of the piezoelectric material constituting the element. The electric field applied for the polarization treatment can be from 800 V/mm to 2.0 kV/mm.

(Resonance-Antiresonance Method)

The piezoelectric constant and the mechanical quality factor of the piezoelectric element can be determined by calculation based on Electronic Materials Manufacturers Association Standard (JEITA EM-4501) from the resonance frequency and the antiresonance frequency measured with a commercially available impedance analyzer. This method is hereinafter referred to as a resonance-antiresonance method.

(Layered Piezoelectric Element)

The layered piezoelectric element of the present invention will now be described.

The layered piezoelectric element according to the present invention is composed of alternately stacked piezoelectric material layers and electrode layers including at least one internal electrode layer. The piezoelectric material layers are made of the piezoelectric material of the present invention.

Figure 2A:
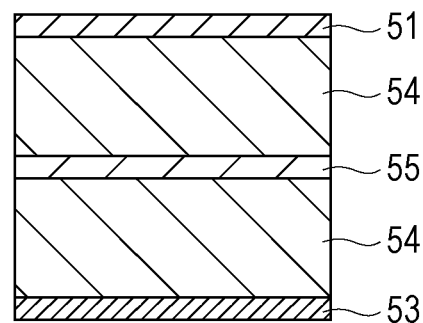
FIG. 2A is a schematic cross-sectional diagram illustrating an embodiment of the configuration of a layered piezoelectric element of the present invention.
Figure 2B:
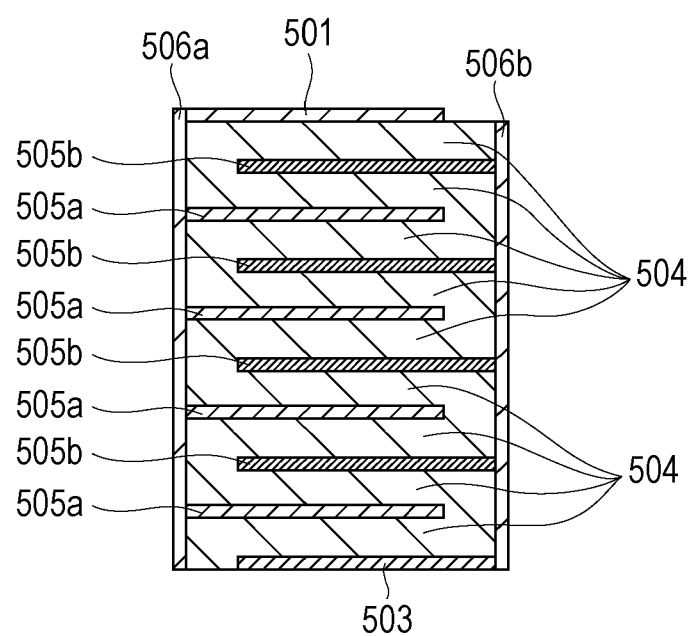
FIG. 2B is a schematic cross-sectional diagram illustrating another embodiment of the configuration of a layered piezoelectric element of the present invention.

FIGS. 2A and 2B are schematic cross-sectional diagrams illustrating embodiments of the configuration of a layered piezoelectric element of the present invention. The layered piezoelectric element according to the present invention is constituted of piezoelectric material layers 54 and electrode layers including an internal electrode layer 55, which are alternately stacked. The piezoelectric material layers 54 are made of the piezoelectric material of the present invention. The electrode layers may include external electrodes such as a first electrode 51 and a second electrode 53, in addition to the internal electrode layer 55.

FIG. 2A shows a configuration of a layered piezoelectric element of the present invention having a layered structure composed of two piezoelectric material layers 54 and one internal electrode layer 55, which are alternately stacked between the first electrode 51 and the second electrode 53. The numbers of the piezoelectric material layers and the internal electrode layers are not limited and may be increased as shown in FIG. 2B. The layered piezoelectric element shown in FIG. 2B has a layered structure composed of nine piezoelectric material layers 504 and eight internal electrode layers 505 (505a or 505b), which are alternately stacked between the first electrode 501 and the second electrode 503. The layered piezoelectric element includes an external electrode 506a and an external electrode 506b for short-circuiting the alternately disposed internal electrode layers.

The sizes and the shapes of the internal electrode layers 55, 505, the external electrodes 506a, 506b, the first electrode 51, 501, and the second electrode 53, 503 are not necessarily the same as those of the piezoelectric material layers 54, 504 and may be divided into two or more pieces.

The internal electrode layers 55, 505, the external electrodes 506a, 506b, the first electrode 51, 501, and the second electrode 53, 503 are conductive layers having a thickness of about 5 nm to 10 μm and may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof. The internal electrode layers 55, 505 and the external electrodes 506a, 506b may be each made of any one of these materials or a mixture or alloy of two or more of these materials or may be each a multilayer made of two or more of these materials. These electrodes may be made of different materials from one another.

The internal electrode layers 55, 505 contain Ag and Pd, and the weight ratio M1/M2 of the content M1 of Ag to the content M2 of Pd can be 1.5 or more and 9.0 or less. A weight ratio M1/M2 of less than 1.5 provides high heat resistance to the internal electrode layers, but increases the electrode cost due to an increase in the amount of the Pd component. In contrast, a weight ratio M1/M2 of higher than 9.0 causes a low heat resistance temperature of the internal electrode layers to form island-like internal electrode layers and to make the surface uneven. Accordingly, from the viewpoint of heat resistance and cost, the weight ratio M1/M2 can be 2.0 or more and 5.0 or less.

From the viewpoint of inexpensive electrode materials, the internal electrode layers 55, 505 can contain at least one of Ni and Cu. In the case of the internal electrode layers 55, 505 containing at least one of Ni and Cu, the layered piezoelectric element of the present invention can be fired in a reducing atmosphere.

As shown in FIG. 2B, a plurality of electrodes including the internal electrode layers 505 may be short-circuited to each other for adjusting the phase of the driving voltage. For example, the internal electrode layers 505a and the first electrode 501 may be short-circuited with the external electrode 506a. The internal electrode layers 505b and the second electrode 503 may be short-circuited with the external electrode 506b. The internal electrode layers 505a and the internal electrode layers 505b may be alternately disposed. The short circuit between electrodes may be performed by any form. An electrode or wiring for short circuit may be disposed on the side of the layered piezoelectric element. Alternatively, electrodes may be short-circuited with a conductive material disposed inside a through-hole formed so as to pass through the piezoelectric material layers 504.

(Production of Layered Piezoelectric Element)

The layered piezoelectric element according to the present invention may be produced by any method. An example of the method of producing the layered piezoelectric element will now be described. The method involves a step (A) of dispersing a metal compound powder at least containing Ba, Ca, Ti, Zr, and Mn to prepare a slurry; a step (B) of disposing the slurry on a base material to prepare a green compact; a step (C) of forming an electrode on the green compact; and a step (D) of sintering the green compact provided with the electrode to form a layered piezoelectric element.

Throughout the specification, the term "powder" is intended to mean an assembly of solid grains and may be an assembly of grains containing Ba, Ca, Ti, Zr, and Mn, or may be an assembly of different types of grains containing arbitrary elements.

Examples of the metal compound powder in the step (A) include Ba compounds, Ca compounds, Ti compounds, Zr compounds, and Mn compounds. Usable examples of the Ba compound include barium oxide, barium carbonate, barium oxalate, barium acetate, barium nitrate, barium titanate, barium zirconate, and barium titanate zirconate.

Usable examples of the Ca compound include calcium oxide, calcium carbonate, calcium oxalate, calcium acetate, calcium titanate, calcium zirconate, and calcium titanate zirconate.

Usable examples of the Ti compound include titanium oxide, barium titanate, barium titanate zirconate, and calcium titanate.

Usable examples of the Zr compound include zirconium oxide, barium zirconate, barium titanate zirconate, and calcium zirconate.

Usable examples of the Mn compound include manganese carbonate, manganese oxide, manganese dioxide, manganese acetate, and trimanganese tetraoxide.

An exemplary method of producing a slurry in the step (A) will be described. The metal compound powder is mixed with 1.6- to 1.7-fold weight of a solvent. The solvent can be, for example, toluene, ethanol, a solvent mixture of toluene and ethanol, n-butyl acetate, or water. The mixture is mixed with a ball mill for 24 hours, and a binder and a plasticizer are then added thereto. Examples of the binder include polyvinyl alcohol (PVA), polyvinyl butyral (PVB), and acrylic resins. In a case of using PVB as the binder, the PVB is weighed such that the weight ratio of the solvent to the PVB is, for example, 88:12. Examples of the plasticizer include dioctyl sebacate, dioctyl phthalate, and dibutyl phthalate. In a case of using dibutyl phthalate as the plasticizer, the amount of the plasticizer is the same as that of the binder. The mixture is mixed again with a ball mill overnight, and the amounts of the solvent and the binder are adjusted such that the slurry has a viscosity of 300 to 500 millipascal-second.

The green compact in the step (B) is a sheet-shaped mixture of the metal compound powder, the binder, and the plasticizer. The green compact in the step (B) can be prepared by, for example, sheet molding. The sheet molding can be performed by, for example, a doctor blade method. In the doctor blade method, the slurry is applied onto a base material with a doctor blade and is dried to form a sheet-shaped green compact. As the base material, for example, a PET film can be used. The surface of the PET film to which the slurry is applied may be coated with fluorine for allowing the green compact to be readily detached from the PET film. The drying may be natural drying or hot air drying. The green compact may have any thickness and can be adjusted depending on the thickness of the layered piezoelectric element. The thickness of the green compact can be increased by, for example, increasing the viscosity of the slurry.

In the step (C), the electrodes, i.e., the internal electrode layers 505 and the external electrodes 506a, 506b, may be produced by any method and may be formed by, for example, baking of a metal paste or by sputtering, vapor deposition, or printing. In order to reduce the driving voltage, the piezoelectric material layers 504 may be produced so as to have a small thickness with a small pitch distance. Such a case selects a process of forming a layered product including a precursor of the piezoelectric material layers 504 and the internal electrode layers 505a, 505b, and then firing the layered product for simultaneously firing the piezoelectric material layers and the internal electrode layers. In such a case, the material for the internal electrode layers is required not to cause a change in shape and a decrease in conductivity at the temperature necessary for sintering the piezoelectric material layers 504. A metal such as Ag, Pd, Au, Cu, or Ni, which has a lower melting point and is less expensive compared to Pt, or an alloy thereof can be used for the internal electrode layers 505a, 505b and external electrodes 506a, 506b. The external electrodes 506a, 506b may be provided after firing of the layered product. In such a case, in addition to Ag, Pd, Cu, and Ni, Al or a carbon-based electrode material can be used.

The electrodes can be formed by screen printing. In the screen printing, a screen printing plate is placed on a green compact disposed on a base material, and a metal paste is applied onto the green compact through the screen printing plate with a spatula. The screen printing plate is at least partially provided with a screen mesh. Consequently, the metal paste passes through the screen mesh and is applied onto the green compact. If the screen mesh of the screen printing plate is provided with a pattern, an electrode can be patterned on the green compact by transferring the pattern to the green compact using the metal paste.

After formation of the electrodes in the step (C), the green compact is detached from the base material. One or a plurality of the stacked green compacts is pressure bonded. Examples of the pressure bonding include uniaxial pressing, cold hydrostatic pressing, and hot hydrostatic pressing. The hot hydrostatic pressing can apply an isotropically uniform pressure. Better bonding can be achieved by raising the temperature to around the glass transition temperature of the binder during the pressure bonding. A desired thickness can be obtained by stacking a plurality of green compacts and pressure bonding them. For example, the green compacts can be layered by stacking 10 to 100 green compacts and applying a pressure of 10 to 60 MPa in the stacking direction at 50° C. to 80° C. for 10 seconds to 10 minutes for thermocompression bonding. A plurality of green compacts can be precisely stacked by placing alignment marks to the electrodes. Alternatively, the green compacts can be precisely stacked by providing through-holes for positioning to the green compacts.

In the step (D), the sintering of the green compact may be performed at any temperature and can be performed at a temperature at which each compound can react and crystals sufficiently grow. For example, the sintering temperature is 1200° C. or more and 1550° C. or less, in particular, 1300° C. or more and 1480° C. or less, from the viewpoint of controlling the ceramic grain diameter within a range of 1 to 10 µm. The layered piezoelectric element sintered in such a temperature range shows good piezoelectric performance.

When a raw material mainly composed of Ni is used for the electrode in the step (C), the step (D) should be performed in a furnace that allows atmospheric firing. The binder is removed by burning at a temperature of 200° C. to 600° C. in the atmosphere, and sintering is then performed at a temperature of 1200° C. to 1550° C. in a reducing atmosphere. Herein, the term "reducing atmosphere" refers to an atmosphere of a gas mixture mainly composed of hydrogen ($H_2$) and nitrogen ($N_2$). The volume fraction of hydrogen and nitrogen ($H_2$:$N_2$) can be in a range of 1:99 to 10:90. The gas mixture may contain oxygen. The oxygen concentration is $10^{-12}$ Pa or more and $10^{-4}$ Pa or less, in particular, $10^{-8}$ Pa or more and $10^{-5}$ Pa or less. The oxygen concentration can be measured with a zirconia type oxygen analyzer. The use of a Ni electrode allows the layered piezoelectric element of the present invention to be inexpensively produced. After the firing in the reducing atmosphere, for example, the temperature is decreased to 600° C., and oxidation can be performed in the atmosphere (oxidizing atmosphere). The sintered compact is then taken out from the firing furnace, and a conductive paste is applied onto the side of the element assembly to which the ends of the internal electrode layers are exposed, followed by drying to form an external electrode.

(Liquid Discharge Head)

The liquid discharge head of the present invention will now be described.

The liquid discharge head according to the present invention at least includes a liquid chamber provided with a vibratory unit including the piezoelectric element or the layered piezoelectric element and a discharge port communicating with the liquid chamber.

Figure 3A:
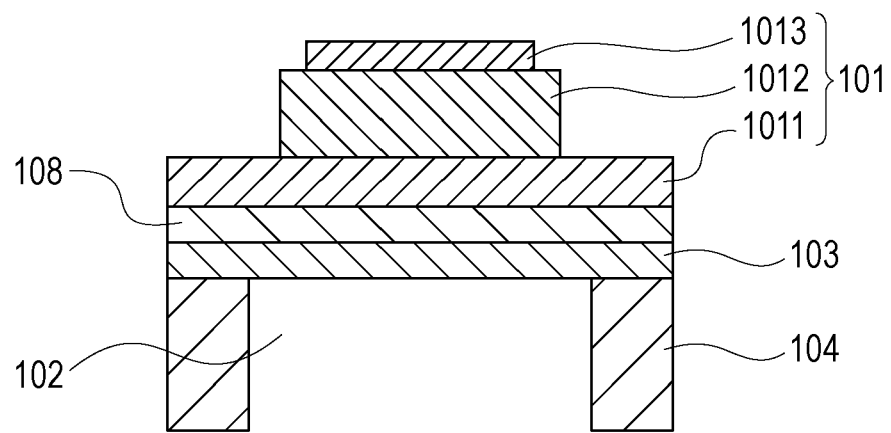
FIG. 3A is a schematic diagram illustrating an embodiment of the configuration of a liquid discharge head of the present invention.
Figure 3B:
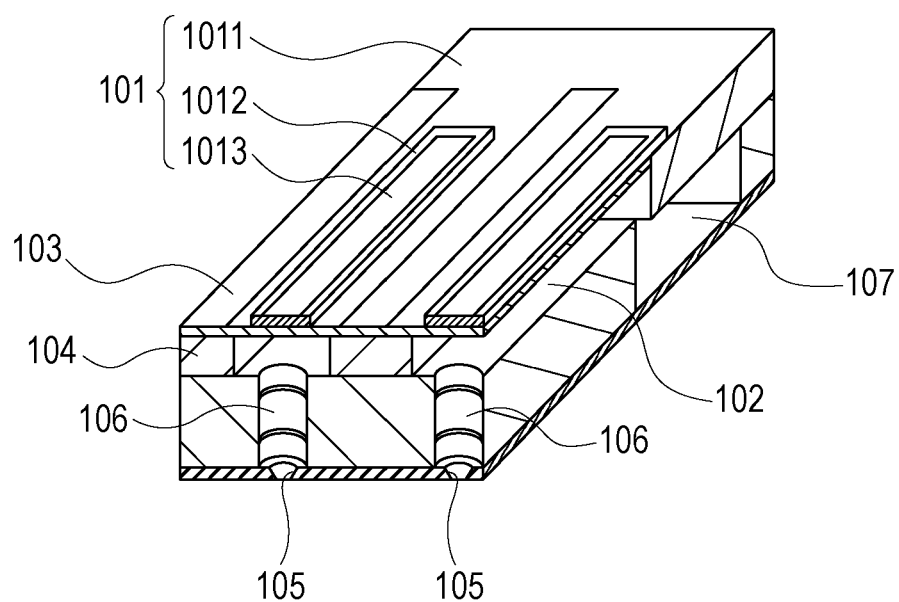
FIG. 3B is another schematic diagram illustrating the embodiment of the configuration of a liquid discharge head of the present invention.

FIGS. 3A and 3B are schematic diagrams illustrating an embodiment of the configuration of a liquid discharge head of the present invention. As shown in FIGS. 3A and 3B, the liquid discharge head of the present invention includes a piezoelectric element 101 of the present invention. The piezoelectric element 101 at least includes a first electrode 1011, a piezoelectric material 1012, and a second electrode 1013. The piezoelectric material 1012 is optionally patterned as shown in FIG. 3B.

FIG. 3B is a schematic diagram of a liquid discharge head. The liquid discharge head includes discharge ports 105, individual liquid chambers 102, communication holes 106 connecting the individual liquid chambers 102 to the corresponding discharge ports 105, liquid chamber partitions 104, a common liquid chamber 107, diaphragms 103, and piezoelectric elements 101. The piezoelectric elements 101 shown in FIG. 3B each have a rectangular shape, but may have any shape such as an elliptical, circular, or parallelogram shape. In general, the piezoelectric material 1012 has a shape along the shape of the individual liquid chamber 102.

The vicinity of the piezoelectric element 101 in the liquid discharge head of the present invention will be described in detail with reference to FIG. 3A. FIG. 3A is a cross-sectional view in the width direction of the piezoelectric element shown in FIG. 3B. The cross section of the piezoelectric element 101 is rectangular, but may be trapezoidal or reverse trapezoidal.

In the drawing, the first electrode 1011 is used as a lower electrode, and the second electrode 1013 is used as an upper electrode. The arrangement of the first electrode 1011 and the second electrode 1013 is not limited to this. For example, the first electrode 1011 may be used as a lower electrode or may be used as an upper electrode. Likewise, the second electrode 1013 may be used as an upper electrode or may be used as a lower electrode. In addition, a buffer layer 108 may be disposed between the diaphragm 103 and the lower electrode. These differences in name are due to the difference in method of producing the devices, and the effects of the present invention can be achieved in any of these cases.

In the liquid discharge head, the diaphragm 103 vibrates up and down by the expansion and contraction of the piezoelectric material 1012 and applies a pressure to the liquid in the individual liquid chamber 102. As a result, the liquid is discharged from the discharge port 105. The liquid discharge head of the present invention can be used in printers or can be applied to production of electronic devices.

The diaphragm 103 can have a thickness of 1.0 μm or more and 15 μm or less, in particular, 1.5 μm or more and 8 μm or less. The diaphragm may be made of any material. For example, the diaphragm can be made of Si. The Si may be doped with boron or phosphorus. In addition, the buffer layer or the electrode layer on the diaphragm may be a part of the diaphragm. The buffer layer 108 can have a thickness of 5 nm or more and 300 nm or less, in particular, 10 nm or more and 200 nm or less. The discharge port 105 has a size of 5 μm or more and 40 μm or less as the equivalent circle diameter. The discharge port 105 may be circular or may have a star, square, or triangle shape.

(Liquid Discharge Device)

The liquid discharge device of the present invention will now be described. The liquid discharge device of the present invention includes a transfer object-holding unit and the liquid discharge head.

Figure 4:
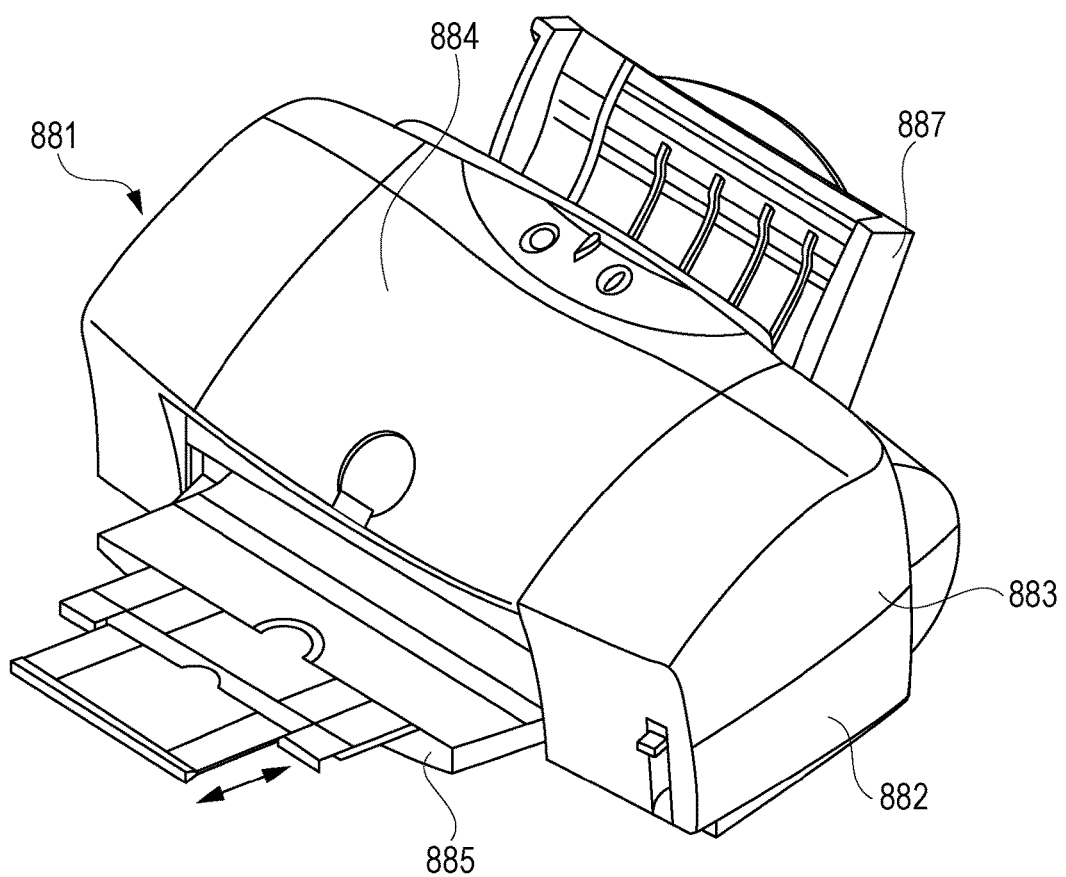
FIG. 4 is a schematic diagram illustrating an embodiment of a liquid discharge device of the present invention.
Figure 5:
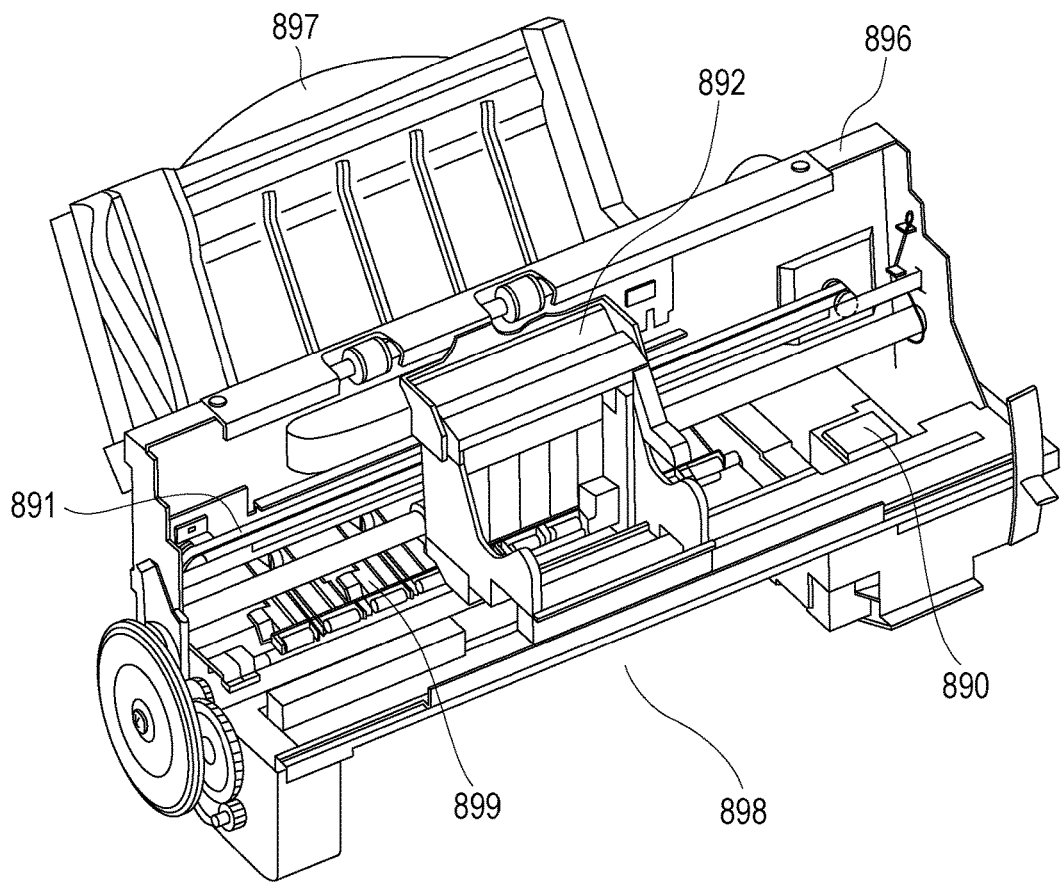
FIG. 5 is a schematic diagram illustrating an embodiment of a liquid discharge device of the present invention.

The ink-jet recording apparatus shown in FIGS. 4 and 5 is an example of the liquid discharge device of the present invention. FIG. 5 shows the liquid discharge device (ink-jet recording apparatus) 881 shown in FIG. 4 in a state where the exteriors 882 to 885 and 887 are removed. The ink-jet recording apparatus 881 includes an automatic feeder 897 for automatically feeding recoding paper as the transfer object in the device main body 896. The ink-jet recording apparatus 881 further includes three portions for conveying the recording paper fed from the automatic feeder 897 to a predetermined recording position and then conveying the recording paper from the recording position to the ejection port 898.

That is, the ink-jet recording apparatus 881 includes a conveying unit 899, which is the transfer object-holding unit; a recording unit 891 for performing recording on the recording paper conveyed to the recording position; and a recovering unit 890 for performing recovering treatment to the recording unit 891. The recording unit 891 is provided with a carriage 892 that receives the liquid discharge head of the present invention and moves on a rail in a reciprocating motion.

In such an ink-jet recording apparatus, the carriage 892 slides on the rail according to the electric signals sent from a computer, and a driving voltage is applied to electrodes to displace the piezoelectric material disposed between the electrodes. The displacement of the piezoelectric material applies a pressure to the individual liquid chamber 102 via the diaphragm 103 shown in FIG. 3B, and thereby an ink is discharged from the discharge port 105 to perform printing.

The liquid discharge device of the present invention can uniformly discharge a liquid at high speed and can be reduced in the size.

The above-described example is a printer, but the liquid discharge device of the present invention can be used not only as an ink-jet recording apparatus, such as a facsimile machine, a multifunction machine, or a copier, but also as a liquid discharge device in industrial use.

In addition, a user can select a desired transfer object depending on the use. A configuration in which the liquid discharge head moves relative to the transfer object placed on a stage serving as the holding unit may be employed.

(Ultrasonic Motor)

The ultrasonic motor of the present invention will now be described. The ultrasonic motor according to the present invention at least includes a vibratory component including the piezoelectric element or the layered piezoelectric element and a movable component being in contact with the vibratory component.

Figure 6A:
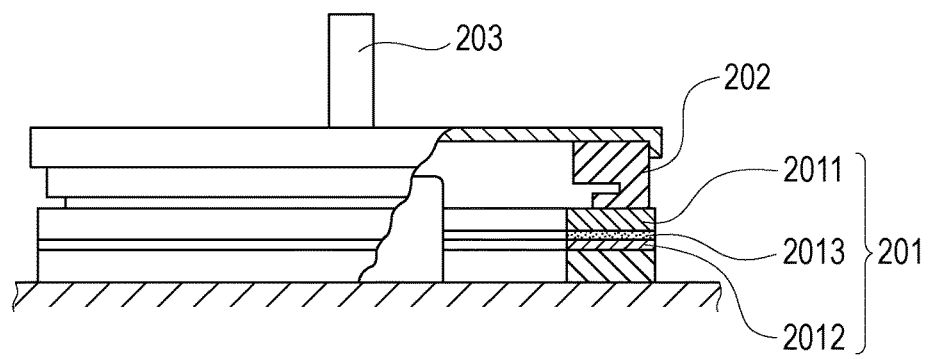
FIG. 6A is a schematic diagram illustrating an embodiment of the configuration of an ultrasonic motor of the present invention.
Figure 6B:
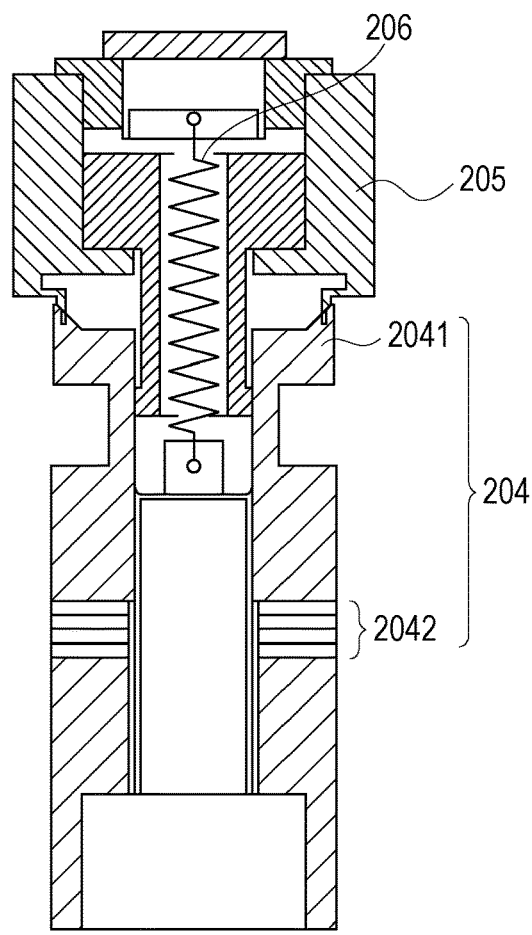
FIG. 6B is another schematic diagram illustrating the embodiment of the configuration of an ultrasonic motor of the present invention.

FIGS. 6A and 6B are schematic diagrams illustrating an embodiment of the configuration of an ultrasonic motor of the present invention. FIG. 6A shows an ultrasonic motor including a single plate piezoelectric element of the present invention. The ultrasonic motor includes an oscillator 201, a rotor 202 being in contact with the sliding surface of the oscillator 201 by means of a pressure applied by a spring (not shown), and an output shaft 203 disposed integrally with the rotor 202. The oscillator 201 is composed of a metal elastic ring 2011, a piezoelectric element 2012 of the present invention, and an organic adhesive (e.g., epoxy or cyanoacrylate adhesive) 2013 for bonding the piezoelectric element 2012 to the elastic ring 2011. The piezoelectric element 2012 of the present invention is constituted of a first electrode, a second electrode (both are not shown), and the piezoelectric material disposed therebetween.

When a two-phase AC voltage different in phase by odd number times $\pi/2$ is applied to the piezoelectric element of the present invention, flexural traveling waves are generated in the oscillator 201, and each point on the sliding surface of the oscillator 201 moves in an elliptic motion. The rotor 202 pressed to the sliding surface of the oscillator 201 receives a frictional force from the oscillator 201 to rotate in the direction opposite to the flexural traveling waves. The object (not shown) to be driven is connected to the output shaft 203 and is driven by the turning force of the rotor 202.

Application of a voltage to a piezoelectric material expands and contracts the piezoelectric material by the transverse piezoelectric effect. When an elastic material such as a metal is in contact with the piezoelectric element, the elastic material is bent by the expansion and contraction of the piezoelectric material. The ultrasonic motor described here utilizes this principle.

FIG. 6B shows an example of an ultrasonic motor including a piezoelectric element having a layered structure. The oscillator 204 is composed of a tubular metal elastic bodies 2041 and a layered piezoelectric element 2042 disposed between the elastic bodies. The layered piezoelectric element 2042 is constituted of a plurality of stacked piezoelectric material layers (not shown) and includes first and second electrodes on the outer surfaces of the stacked piezoelectric material layers and internal electrode layers between the stacked piezoelectric material layers. The metal elastic bodies 2041 are connected to each other with a bolt to fix the piezoelectric element 2042 therebetween to form the oscillator 204.

Application of an AC voltage different in phase to the layered piezoelectric element 2042 generates two vibrations rectangular to each other in the oscillator 204. The two vibrations are combined to create a circular vibration for driving the end portion of the oscillator 204. The oscillator 204 is provided with a circumferential groove at the upper portion to enlarge the displacement of the vibration for driving.

The rotor 205 is in pressurized contact with the oscillator 204 by means of the pressurizing spring 206 to create a frictional force for driving. The rotor 205 is rotatably supported by bearing.

(Optical Apparatus)

The optical apparatus of the present invention will now be described. The optical apparatus of the present invention includes a driving unit including the ultrasonic motor.

Figure 7A:
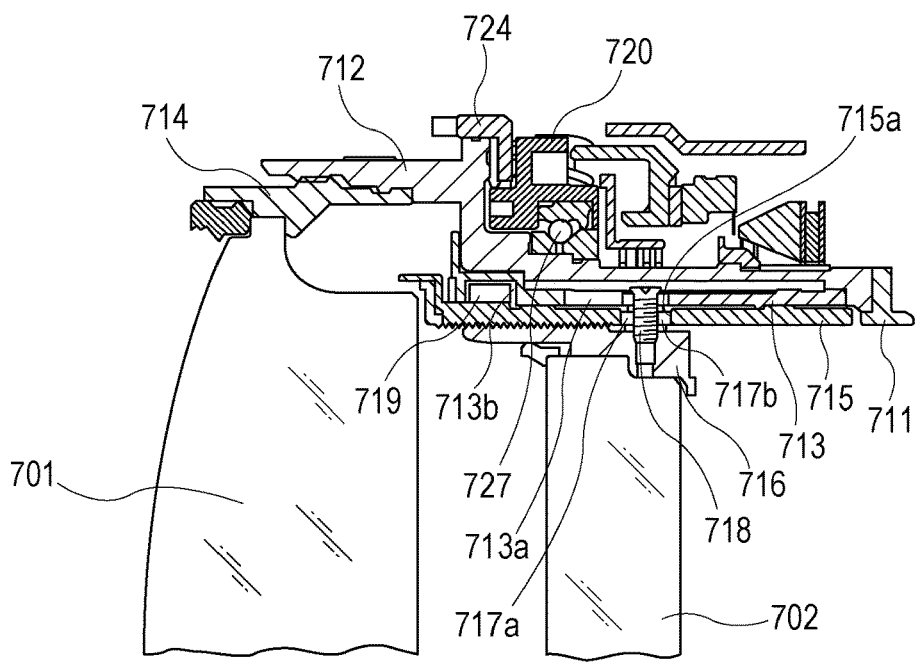
FIG. 7A is a schematic diagram illustrating an embodiment of an optical apparatus of the present invention.
Figure 7B:
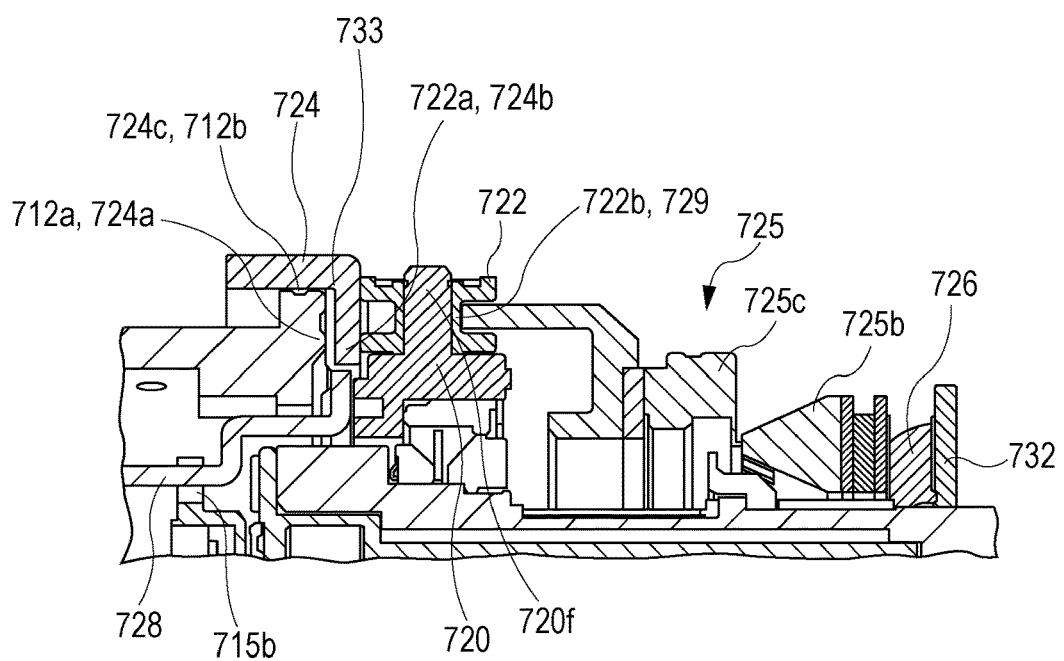
FIG. 7B is another schematic diagram illustrating the embodiment of an optical apparatus of the present invention.

FIGS. 7A and 7B are main cross-sectional views of an interchangeable lens barrel of a single lens reflex camera as an embodiment of the optical apparatus of the present invention. FIG. 8 is an exploded perspective view of an interchangeable lens barrel of a single lens reflex camera as an embodiment of the optical apparatus of the present invention. A fixing barrel 712, a linear guide barrel 713, and a front lens group barrel 714 are fixed to the detachable camera mount 711. These barrels are fixing members of the interchangeable lens barrel.

The linear guide barrel 713 is provided with a forward guide groove 713a for the focus lens 702 in the optical axis direction. Cam rollers 717a and 717b protruding to the outside in the diameter direction are fixed, with an axial screw 718, to the rear lens group barrel 716 holding the focus lens 702. The cam roller 717a fits in the forward guide groove 713a.

A cam ring 715 turnably fits in the inner circumference of the linear guide barrel 713. The linear guide barrel 713 and the cam ring 715 are restricted from relative displacement in the optical axis direction by fitting the roller 719 fixed to the cam ring 715 in the circumferential groove 713b of the linear guide barrel 713. The cam ring 715 is provided with a cam groove 715a for the focus lens 702, and the cam roller 717b also fits in the cam groove 715a.

A rotation transmitting ring 720 is disposed on the outer circumference side of the fixing barrel 712 and is held by a ball race 727 so as to be turnable at a fixed position with respect to the fixing barrel 712. The rotation transmitting ring 720 has a shaft 720f radially extending from the rotation transmitting ring 720, and a driven roller 722 is turnably held by the shaft 720f. The large-diameter portion 722a of the driven roller 722 is in contact with the mount side end face 724b of the manual focus ring 724. The small-diameter portion 722b of the driven roller 722 is in contact with a connecting member 729. Six driven rollers 722 are disposed on the outer circumference of the rotation transmitting ring 720 at equal intervals, and each driven roller is disposed as described above.

A low friction sheet (washer member) 733 is disposed at the inner diameter portion of the manual focus ring 724 so as to be held between the mount side end face 712a of the fixing barrel 712 and the front side end face 724a of the manual focus ring 724. The outer diameter surface of the low friction sheet 733 is in a ring shape and fits in the inner diameter portion 724c of the manual focus ring 724, and the inner diameter portion 724c of the manual focus ring 724 further fits in the outer diameter portion 712b of the fixing barrel 712. The low friction sheet 733 reduces the friction in the turning ring mechanism for relatively turning the manual focus ring 724 around the optical axis with respect to the fixing barrel 712.

The large-diameter portion 722a of the driven roller 722 and the mount side end face 724b of the manual focus ring are in contact with each other with a pressure caused by the force of a wave washer 726 for pressing the ultrasonic motor 725 toward the front of the lens. Similarly, the small-diameter portion 722b of the driven roller 722 and the connecting member 729 are in contact with each other with an appropriate pressure caused by the force of the wave washer 726 for pressing the ultrasonic motor 725 toward the front of the lens. The wave washer 726 is restricted from movement toward the mount direction by a washer 732 bayonet-connected to the fixing barrel 712. The spring force (biasing force) generated by the wave washer 726 is transmitted to the ultrasonic motor 725 and further to the driven roller 722 and thereby also serves as a force of the manual focus ring 724 pressing the mount side end face 712a of the fixing barrel 712. That is, the manual focus ring 724 is incorporated in a state of being pressed to the mount side end face 712a of the fixing barrel 712 via the low friction sheet 733.

Consequently, when the ultrasonic motor 725 is driven so as to turn with respect to the fixing barrel 712 by a controller (not shown), since the connecting member 729 is in a frictional contact with the small-diameter portion 722b of the driven roller 722, the driven roller 722 turns around the shaft 720f. The turning of the driven roller 722 around the shaft 720f results in turning of the rotation transmitting ring 720 around the optical axis (autofocus operation).

Application of a turning force around the optical axis to the manual focus ring 724 from a manual manipulation input unit (not shown) acts as follows.

That is, since the mount side end face 724b of the manual focus ring 724 is in a pressing-contact with the large-diameter portion 722a of the driven roller 722, the driven roller 722 turns around the shaft 720f by the frictional force. The turning of the large-diameter portion 722a of the driven roller 722 around the shaft 720f turns the rotation transmitting ring 720 around the optical axis. On this occasion, the friction holding power of a rotor 725c and a stator 725b prevents the ultrasonic motor 725 from turning (manual focus operation).

The rotation transmitting ring 720 is provided with two focus keys 728 at positions to oppose each other. The focus keys 728 fit in the notches 715b formed at the end portion of the cam ring 715. Consequently, turning of the rotation transmitting ring 720 around the optical axis by the autofocus operation or the manual focus operation transmits the turning force to the cam ring 715 via the focus keys 728 to turn the cam ring around the optical axis. As a result, the rear lens group barrel 716 that is restricted in turning by the cam roller 717a and the forward guide groove 713a moves along the cam groove 715a of the cam ring 715 by the cam roller 717b. Thus, the focus lens 702 is driven to perform focus operation.

Here, an interchangeable lens barrel of a single lens reflex camera has been described as an example of the optical apparatus of the present invention. The present invention can be applied to any optical apparatus having an ultrasonic motor in the driving unit, such as a compact camera and an electronic still camera, regardless of the types of cameras.

(Vibratory Device and Dust Removing Device)

Vibratory devices for, for example, conveying or removing particles, powder, or droplets are widely used in electronic apparatuses. A dust removing device including the piezoelectric element of the present invention will now be described as an example of the vibratory device of the present invention.

The dust removing device according to the present invention at least includes a vibratory component having a diaphragm provided with the piezoelectric element or the layered piezoelectric element and has a function of removing dust adhering to the surface of the diaphragm.

Figure 9A:
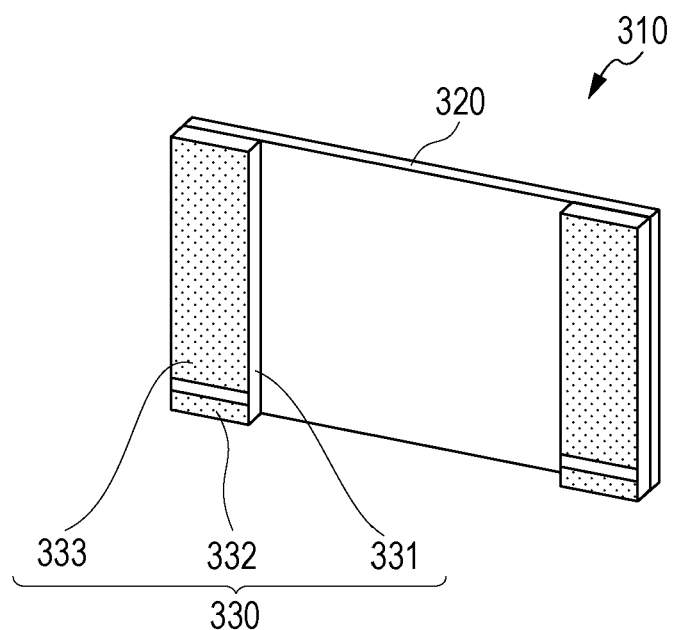
FIG. 9A is a schematic diagram illustrating an embodiment of a vibratory device of the present invention used as a dust removing device.
Figure 9B:
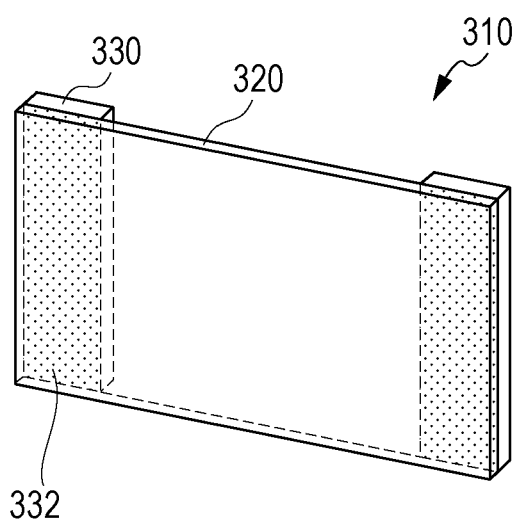
FIG. 9B is another schematic diagram illustrating the embodiment of a vibratory device of the present invention used as a dust removing device.

FIGS. 9A and 9B are schematic diagrams illustrating an embodiment of the dust removing device of the present invention. The dust removing device 310 is constituted of a tabular piezoelectric element 330 and a diaphragm 320. The piezoelectric element 330 may be a layered piezoelectric element of the present invention. The diaphragm 320 may be made of any material. When the dust removing device 310 is used in an optical device, a transparent material or a light-reflective material can be used for the diaphragm 320, and the transparent unit and the light-reflective unit of the diaphragm are the targets of removal of dust.

Figure 10A:
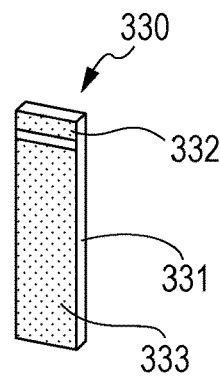
FIG. 10A is a schematic diagram illustrating the configuration of a piezoelectric element in a dust removing device of the present invention.
Figure 10B:
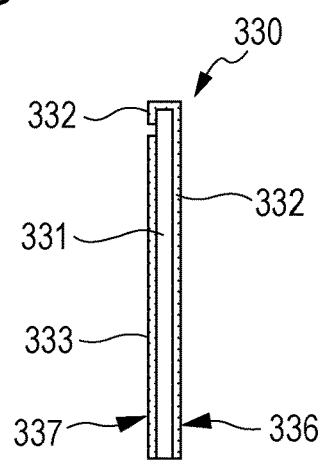
FIG. 10B is a schematic diagram illustrating the configuration of the piezoelectric element in a dust removing device of the present invention.
Figure 10C:
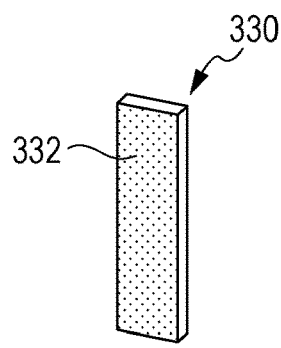
FIG. 10C is a schematic diagram illustrating the configuration of the piezoelectric element in a dust removing device of the present invention.

FIGS. 10A to 10C are schematic diagrams illustrating the configuration of a piezoelectric element 330 shown in FIGS. 9A and 9B. FIGS. 10A and 10C illustrate the structures of the front and the rear faces of the piezoelectric element 330, and FIG. 10B illustrates the structure of the side face. As shown in FIGS. 9A and 9B (FIGS. 10A to 10C), the piezoelectric element 330 is composed of a piezoelectric material 331, a first electrode 332, and a second electrode 333. The first electrode 332 and the second electrode 333 are respectively arranged on the surfaces of the tabular piezoelectric material 331 so as to oppose each other. As in the piezoelectric element shown in FIGS. 9A and 9B, the piezoelectric element 330 may be a layered piezoelectric element of the present invention. In such a case, the piezoelectric material 331 has a structure of alternately arranged piezoelectric material layers and internal electrode layers, and the internal electrode layers are alternately short-circuited with the first electrode 332 or the second electrode 333 to give a driving waveform to each layer of the piezoelectric material with different phases. The face of the first electrode 332 of the piezoelectric element 330 shown in FIG. 10C is a first electrode face 336, and the face of the second electrode 333 of the piezoelectric element 330 shown in FIG. 10A is a second electrode face 337.

The electrode face is the face of the piezoelectric element on which the electrode is disposed. For example, as shown in FIGS. 10A to 10C, the first electrode 332 may go around to the second electrode face 337.

As shown in FIGS. 9A and 9B, the first electrode face 336 of the piezoelectric element 330 is fixed to the plate face of the diaphragm 320. Stress is generated between the piezoelectric element 330 and the diaphragm 320 by driving the piezoelectric element 330 to generate out-of-plane vibration in the diaphragm. The dust removing device 310 of the present invention is a device for removing foreign substance such as dust adhered to the surface of the diaphragm 320 by the out-of-plane vibration of the diaphragm 320. The term "out-of-plane vibration" refers to elastic vibration that displaces the diaphragm in the optical axis direction, i.e., in the thickness direction of the diaphragm.

Figure 11:
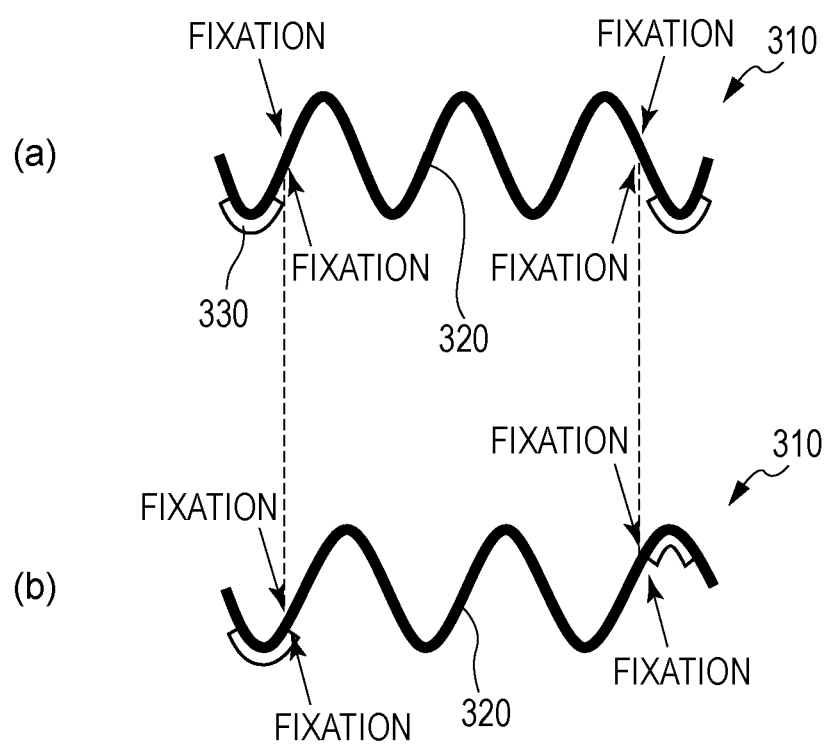
FIG. 11 includes schematic diagrams illustrating the vibration principle of a dust removing device of the present invention.

FIG. 11 includes schematic diagrams illustrating the vibration principle of the dust removing device 310 of the present invention. FIG. 11(a) shows a state of generating out-of-plane vibration in the diaphragm 320 by applying an in-phase AC voltage to a pair of piezoelectric elements 330. The polarization direction of the piezoelectric material constituting the pair of piezoelectric elements 330 is identical with the thickness direction of the piezoelectric elements 330. The dust removing device 310 is driven by a seventh vibration mode. FIG. 11(b) shows a state of generating out-of-plane vibration in the diaphragm 320 by applying a reverse-phase AC voltage having a phase opposite by 180° to a pair of piezoelectric elements 330. The dust removing device 310 is driven by a sixth vibration mode. The dust removing device 310 of the present invention can effectively remove dust adhered to the surface of a diaphragm by properly using at least two vibration modes.

(Image Pickup Device)

Figure 12:
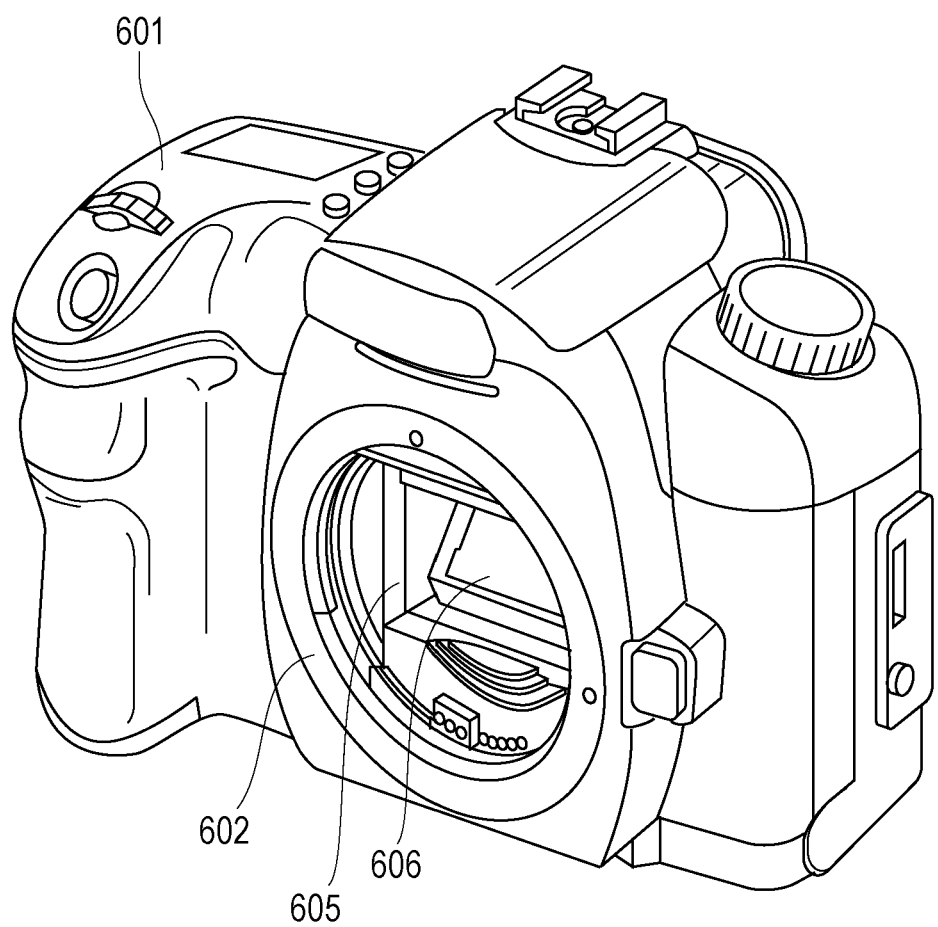
FIG. 12 is a schematic diagram illustrating an embodiment of an image pickup device of the present invention.
Figure 13:
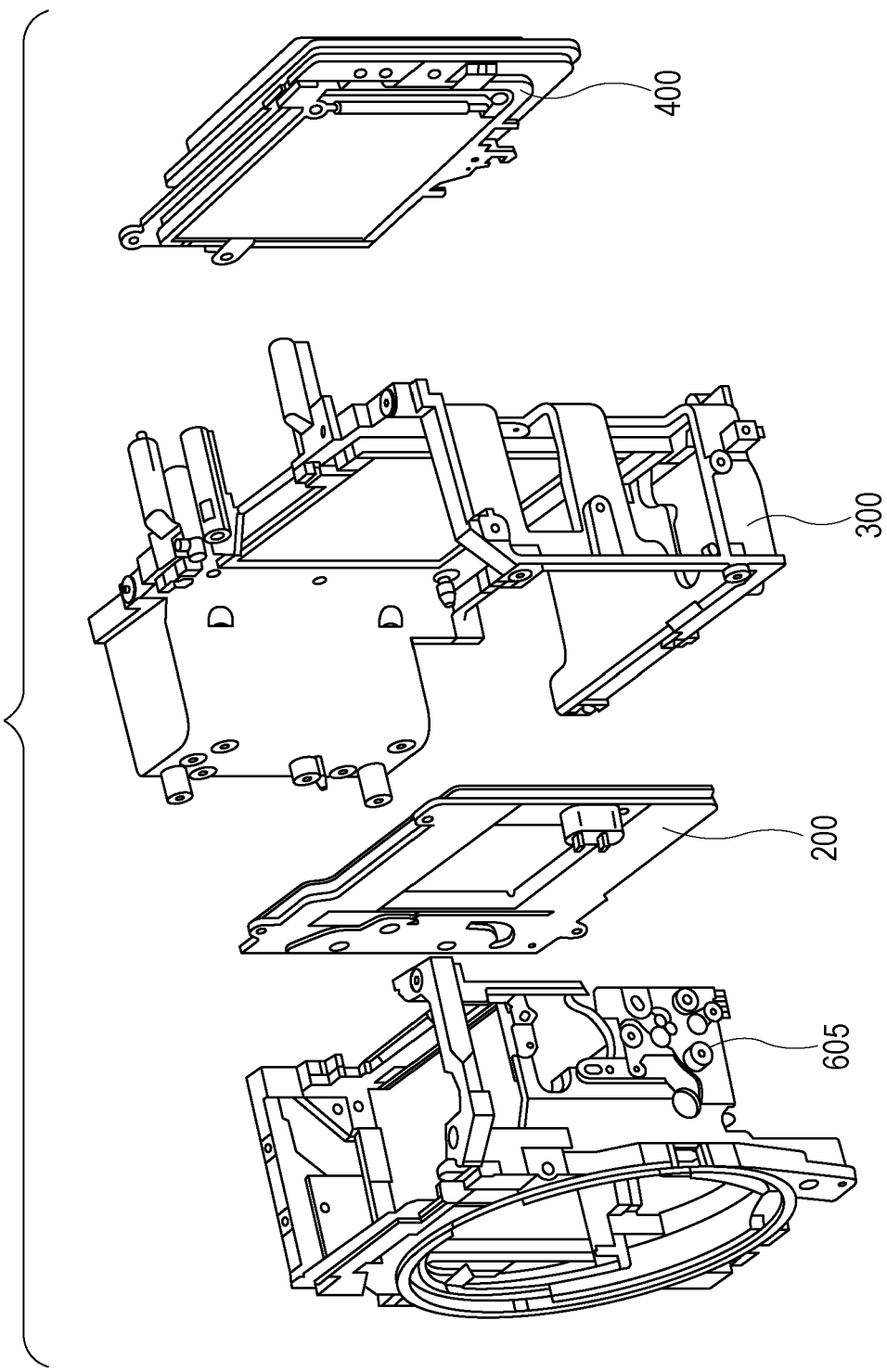
FIG. 13 is a schematic diagram illustrating an embodiment of an image pickup device of the present invention.

The image pickup device of the present invention will now be described. The image pickup device of the present invention at least includes the dust removing device and an image pickup element unit and has the diaphragm of the dust removing device on the light-receiving surface side of the image pickup element unit. FIGS. 12 and 13 are diagrams illustrating a digital single lens reflex camera as an embodiment of the image pickup device of the present invention.

FIG. 12 is a front perspective view of a camera body 601 viewed from the object side, in a state in which the image pickup lens unit is removed. FIG. 13 is an exploded perspective view schematically illustrating the structure of the inside of the camera for describing the dust removing device of the present invention and the surrounding structure of a pickup unit 400.

A mirror box 605 is disposed in the camera body 601 shown in FIG. 12, and a main mirror (quick return mirror) 606 is disposed in the mirror box 605. Image pickup light beams passed through the image pickup lens are guided into the mirror box 605. The main mirror 606 can take a state being held at an angle of 45° with respect to the image pickup optical axis for guiding image pickup light beams to the direction of the penta roof mirror (not shown) and a state being held at a position evacuated from image pickup light beams for guiding the image pickup light beams to the direction of the image pickup element (not shown).

In FIG. 13, on the object side of the body chassis 300 serving as the skeleton of the camera body, the mirror box 605 and a shutter unit 200 are disposed in this order from the object side. Furthermore, an image pickup unit 400 is disposed on the photographer side of the body chassis 300. The image pickup unit 400 is composed of the diaphragm of a dust removing device and an image pickup element unit. The diaphragm of the dust removing device and the light-receiving surface of the image pickup element unit are disposed on the same axis. The image pickup unit 400 is set to the clamp face of the mount portion 602 (FIG. 12) serving as the basis for setting the image pickup lens unit such that the image pickup face of the image pickup element unit is parallel to the clamp face with a predetermined distance therebetween.

Herein, a digital single lens reflex camera has been described as an example of the image pickup device of the present invention. The image pickup device may be, for example, an image pickup lens interchangeable camera such as a mirror-less digital single lens camera not having the mirror box 605. The present invention can also be applied to any apparatus required to remove dust adhering to the surfaces of, in particular, the optical parts of various image pickup devices, such as image pickup unit interchangeable video cameras, copiers, facsimile machines, and scanners, or electronic electric apparatuses having image pickup devices.

(Piezoelectric Acoustic Component)

Figure 14:
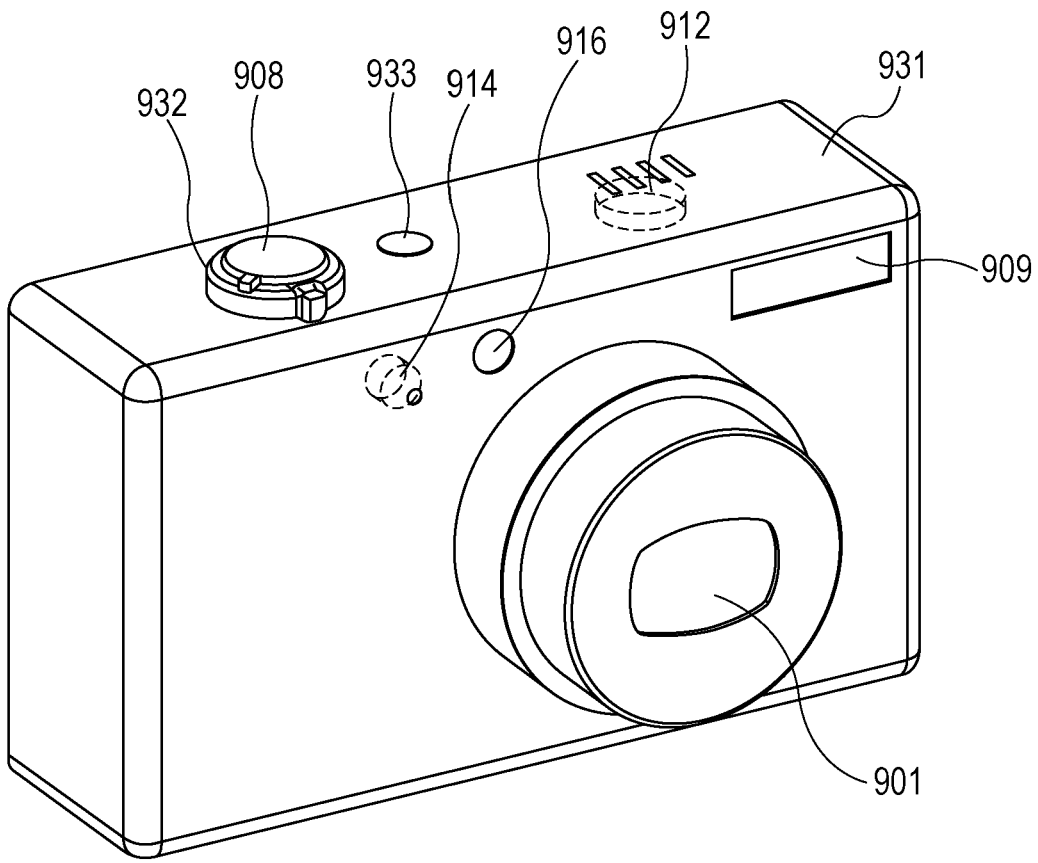
FIG. 14 is a schematic diagram illustrating an embodiment of an electronic apparatus of the present invention.

The piezoelectric acoustic component of the present invention will now be described. The piezoelectric acoustic component of the present invention includes the piezoelectric element or the layered piezoelectric element. Examples of the piezoelectric acoustic component include loudspeakers, buzzers, microphones, and surface acoustic wave (SAW) elements. FIG. 14 is a perspective general view of a digital camera, an embodiment of the electronic apparatus including a piezoelectric acoustic component of the present invention, viewed from the front.

(Electronic Apparatus)

The electronic apparatus of the present invention will now be described. The electronic apparatus of the present invention includes the piezoelectric element or the layered piezoelectric element.

FIG. 14 is a perspective general view of a digital camera body 931, an embodiment of the electronic apparatus of the present invention, viewed from the front. On the front of the body 931, an optical device 901, a microphone 914, a stroboscope light emitting unit 909, and an assist light unit 916 are disposed. The microphone 914 is incorporated in the inside of the body and is therefore indicated by a dashed line. A hole is provided in the body on the front of the microphone 914 for picking up sounds from the outside.

On the upper face of the body 931, a power button 933, a loudspeaker 912, a zoom lever 932, and a release button 908 for performing the focusing operation are arranged. The loudspeaker 912 is incorporated in the inside of the body 931 and is therefore indicated by a dashed line. Holes are provided in the body on the front of the loudspeaker 912 for transmitting sounds to the outside.

The piezoelectric acoustic component of the present invention is used in at least one of the microphone 914, the loudspeaker 912, and the surface acoustic wave element.

Figure 15:
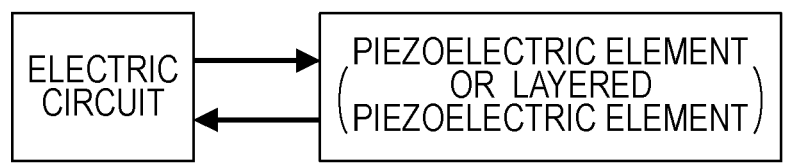
FIG. 15 is a schematic diagram illustrating an embodiment of an electronic apparatus including a piezoelectric element of the present invention.

Herein, a digital camera has been described as the electronic apparatus of the present invention. The electronic apparatus of the present invention can also be applied to electronic apparatuses having various piezoelectric acoustic components such as sound reproducers, recorders, cellular phones, and information terminals. FIG. 15 is a schematic diagram illustrating a configuration of an electronic apparatus including a piezoelectric element or layered piezoelectric element of the present invention. The electronic apparatus example of the present invention shown in FIG. 15 includes a piezoelectric element or layered piezoelectric element of the present invention, and includes an electric circuit that inputs power to or extracts power from the piezoelectric element or layered piezoelectric element. The input of power to the piezoelectric element or layered piezoelectric element allows expression of the function due to the inverse piezoelectric effect. In contrast, the extraction of power from the piezoelectric element or layered piezoelectric element allows detection of electric signals or extraction of energy caused by the direct piezoelectric effect.

As described above, the piezoelectric element or the layered piezoelectric element of the present invention can be suitably applied to liquid discharge heads, liquid discharge devices, ultrasonic motors, optical apparatuses, vibratory devices, dust removing devices, image pickup devices, piezoelectric acoustic component, and electronic apparatuses.

The use of the piezoelectric element or the layered piezoelectric element of the present invention can provide a liquid discharge head having a nozzle density and a discharge rate that are equivalent to or higher than those in the case of using a piezoelectric element containing lead.

The use of the liquid discharge head of the present invention can provide a liquid discharge device having a discharge rate and a discharge precision that are equivalent to or higher than those in the case of using a piezoelectric element containing lead.

The use of the piezoelectric element or the layered piezoelectric element of the present invention can provide an ultrasonic motor having driving power and durability that are equivalent to or higher than those in the case of using a piezoelectric element containing lead.

The use of the ultrasonic motor of the present invention can provide an optical apparatus having durability and an operation precision that are equivalent to or higher than those in the case of using a piezoelectric element containing lead.

The use of the piezoelectric element or the layered piezoelectric element of the present invention can provide a vibratory device having vibration ability and durability that are equivalent to or higher than those in the case of using a piezoelectric element containing lead.

The use of the vibratory device of the present invention can provide a dust removing device having dust removing efficiency and durability that are equivalent to or higher than those in the case of using a piezoelectric element containing lead.

The use of the dust removing device of the present invention can provide an image pickup device having a dust removing function that is equivalent to or higher than that in the case of using a piezoelectric element containing lead.

The use of a piezoelectric acoustic component including the piezoelectric element or the layered piezoelectric element of the present invention can provide an electronic apparatus having sound-producing ability that is equivalent to or higher than that in the case of using a piezoelectric element containing lead.

The piezoelectric material of the present invention can be used not only in liquid discharge heads and motors but also in devices such as ultrasonic vibrators, piezoelectric actuators, piezoelectric sensors, and ferroelectric memories.

EXAMPLES

The piezoelectric material and the piezoelectric element of the present invention will now be more specifically described by examples, but the present invention is not limited to the following examples.

Example 1

Raw materials corresponding to a composition represented by Formula (1): $(Na_xBa_{1-x})(Nb_yTi_{1-y})O_3$, wherein x is 0.87, y is 0.88, and x/y is 0.99, i.e., $(Na_{0.87}Ba_{0.12})(Nb_{0.88}Ti_{0.12})O_3$, were weighed as follows.

Raw materials, sodium carbonate ($Na_2CO_3$, purity: 99.9% or more), niobium oxide ($Nb_2O_5$, purity: 99%, average grain diameter: 1000 nm), and barium titanate ($BaTiO_3$, purity: 99.9% or more, average grain diameter: 100 nm), were weighed at a ratio of Na, Ba, Nb, and Ti to give a composition $(Na_{0.87}Ba_{0.12})(Nb_{0.88}Ti_{0.12})O_3$. Nickel oxide (Ni(II)O, purity: 99.9%, average grain diameter: 7000 nm) was weighed such that the content of Ni was 0.005 mol based on 1 mol of the composition $(Na_{0.87}Ba_{0.12})(Nb_{0.88}Ti_{0.12})O_3$. Similarly, manganese oxide (Mn(IV)$O_2$, purity: 99.9%) was weighed such that the content of Mn was 0.005 mol, and magnesium oxide (MgO, purity: 99.99% or more) was weighed such that the content of Mg was 0.001 mol. These weighed powders and ethanol were wet-mixed using a ball mill for 24 hours. The mixture slurry was taken out from the ball mill and was heated at 80° C. to remove ethanol to prepare a mixed raw material powder. The mixed raw material powder was then heated at 900° C. in the atmosphere for 3 hours to give a calcined powder. The calcined powder was pulverized, and a polyvinyl butyral (PVB) binder was added to the calcined powder in an amount of 3 wt % relative to the weight of the calcined powder for granulation. A mold was filled with the granulated powder, and the granulated powder was compressed at a pressure of 200 MPa into a green compact having a diameter of 17 mm and a thickness of about 1 mm. The resulting green compact was heated at 1200° C. in the atmosphere for 6 hours as a firing process to give a piezoelectric material of the present invention as a ceramic sample.

The composition of the piezoelectric material was evaluated by inductively coupled plasma atomic emission spectrometry (ICP). The results demonstrated that the piezoelectric material of this Example was mainly composed of a metal oxide represented by $(Na_{0.84}Ba_{0.12})(Nb_{0.88}Ti_{0.12})O_3$ and contained 0.005 mol of Ni, 0.005 mol of Mn, and 0.001 mol of Mg based on 1 mol of the main component. The contents of Pb, K, and Co were each less than 1000 ppm based on 1 mol of the piezoelectric material. In this Example, the composition after sintering was substantially the same as the weighed composition by performing the firing at 1200° C. Even if the amount of Na was decreased by heat treatment, a ceramic sample having a target composition could be obtained by increasing the amount of the sodium compound according to the decrement in the process.

The average equivalent circle diameter and the relative density of the crystal grains constituting the piezoelectric material were evaluated and were 2.5 μm and 97%, respectively. The crystal grains were mainly observed with a polarizing microscope, but the grain diameter of small crystal grains was specified with a scanning electron microscope (SEM). The average equivalent circle diameter was calculated by image processing of these observation images. The relative density was evaluated by an Archimedes's method.

Subsequently, the piezoelectric material was polished into a thickness of about 0.5 mm. X-ray diffraction of the polished surface of the sample at room temperature (27° C.) demonstrated that the primary phase of the ceramic sample was of a perovskite-type structure, and no diffraction of another phase was detected.

Subsequently, a piezoelectric element of the present invention was produced. In order to remove the stress inside the polished piezoelectric material and the organic components on the surface of the material, the piezoelectric material was heated at 400° C. in the atmosphere for 30 minutes. A metal electrode having a thickness of 400 nm was formed on each surface of the heat-treated piezoelectric material by DC sputtering. A titanium adhesive layer having a thickness of 30 nm was formed between each electrode and the ceramic. The resulting ceramic provided with electrodes was cut into a 10×2.5×0.5 mm strip-like piezoelectric element of the present invention.

Examples 2 to 10

Piezoelectric materials and piezoelectric elements of Examples 2 to 10 were produced as in Example 1 except that the target compositions were those shown in Table 1. The compositions of the piezoelectric materials were evaluated as in Example 1 and were confirmed to be the same as the compositions shown in Table 1. In Table 1, x represents the molar ratio of Na, y represents the molar ratio of Nb, z represents the molar ratio of Ni, w represents the molar ratio of Mn, and a represents the molar ratio of Mg. The contents of Pb, K, and Co are not shown in the table, but were each less than 1000 ppm based on 1 mol of the piezoelectric material in each Example.

The average equivalent circle diameters and relative densities of the piezoelectric materials of Examples 2 to 10 were also evaluated as in Example 1. Every average equivalent circle diameter was in a range of 0.5 μm or more and 20 μm or less, the minimum average equivalent circle diameter was that of the piezoelectric material of Example 9, and the maximum average equivalent circle diameter was that of the piezoelectric material of Example 10. Every relative density was in a range of 93% to 99%, the minimum relative density was that of the piezoelectric material of Example 10, and the maximum relative density was that of the piezoelectric material of Example 3.

The piezoelectric materials of Examples 2 to 10 were polished as in Example 1, and the polished surfaces were subjected to X-ray diffraction measurement at room temperature. The primary phase of every piezoelectric material was of perovskite-type structure, and no diffraction of another phase was detected.

(Influence of Firing Temperature)

Substantially the same piezoelectric materials were obtained when the firing temperature of the piezoelectric materials of Examples 1 to 10 was changed to 1160° C., whereas a firing temperature of 1100° C. provided a piezoelectric material having a relative density of less than 93% in some compositions. A firing temperature of 1250° C. provided a piezoelectric material having an average equivalent circle diameter of larger than 30 μm in some compositions.

Comparative Examples 1 to 7

Ceramics and elements of Comparative Examples 1 to 7 were produced as in Example 1. The target compositions are shown in Table 1. Evaluation of the ceramics as in Example 1 demonstrated that the ceramics had the compositions shown in Table 1.

The average equivalent circle diameters and the relative densities of the ceramics of Comparative Examples 1 to 7 were evaluated as in Example 1. Every ceramic had an average equivalent circle diameter in a range of 0.5 to 20 μm and a relative density in a range of 93% to 99%.

The ceramics of Comparative Examples 1 to 7 were polished as in Example 1, and the polished surfaces were subjected to X-ray diffraction measurement at room temperature. In the ceramics of Comparative Examples 1 to 3, 6, and 7, the primary phase was of perovskite-type structure, and no diffraction of another phase was detected. In the ceramics of Comparative Examples 4 and 5, however, although a diffraction peak of a perovskite-type structure was observed, a diffraction peak not identifying any structure having an intensity of about one-fifth was also observed.

TABLE 1

| Sample | $(Na_xBa_{1-y})(Nb_yTi_{1-y})O_3$ (1 mol) | | | Ni (mol) | Mn (mol) | Mg (mol) |
|---|---|---|---|---|---|---|
| | x | y | x/y | z | w | α |
| Example 1 | 0.87 | 0.88 | 0.99 | 0.005 | 0.005 | 0.001 |
| Example 2 | 0.85 | 0.88 | 0.97 | 0.005 | 0.005 | 0.005 |
| Example 3 | 0.84 | 0.88 | 0.95 | 0.005 | 0.002 | 0.010 |
| Example 4 | 0.87 | 0.88 | 0.99 | 0.005 | 0.002 | 0.020 |

TABLE 1-continued

| Sample | $(Na_xBa_{1-x})(Nb_yTi_{1-y})O_3$ (1 mol) | | | Ni (mol) | Mn (mol) | Mg (mol) |
| --- | --- | --- | --- | --- | --- | --- |
| | x | y | x/y | z | w | α |
| Example 5 | 0.83 | 0.85 | 0.98 | 0.002 | 0.004 | 0.010 |
| Example 6 | 0.83 | 0.85 | 0.98 | 0.010 | 0.004 | 0.010 |
| Example 7 | 0.85 | 0.85 | 1.00 | 0.020 | 0.002 | 0.010 |
| Example 8 | 0.83 | 0.85 | 0.98 | 0.050 | 0.001 | 0.010 |
| Example 9 | 0.89 | 0.90 | 0.99 | 0.005 | 0 | 0.010 |
| Example 10 | 0.95 | 0.95 | 1.00 | 0 | 0.005 | 0.010 |
| Comparative Example 1 | 0.82 | 0.88 | 0.93 | 0.005 | 0 | 0 |
| Comparative Example 2 | 0.87 | 0.88 | 0.99 | 0 | 0.005 | 0.050 |
| Comparative Example 3 | 0.88 | 0.88 | 1.00 | 0 | 0 | 0.020 |
| Comparative Example 4 | 0.93 | 0.95 | 0.98 | 0.060 | 0.005 | 0.010 |
| Comparative Example 5 | 0.83 | 0.85 | 0.98 | 0.005 | 0.010 | 0.010 |
| Comparative Example 6 | 0.85 | 0.80 | 1.06 | 0.010 | 0 | 0.005 |
| Comparative Example 7 | 0.97 | 0.97 | 1.00 | 0.010 | 0 | 0.005 |

(Evaluation of Characteristics (Electric Resistivity, Curie Temperature, Ferroelectricity, and Piezoelectricity) of Piezoelectric Element)

The piezoelectric elements prepared in Examples 1 to 10 and the elements prepared in Comparative Examples 1 to 7 were evaluated for electric resistivity with a semiconductor parameter analyzer. The resistivity was determined by applying a DC voltage of 10 V between two electrodes of the elements disposed so as to face each other at room temperature (27° C.) and measuring the leak current after 20 seconds from the application. A resistivity of $1.0 \times 10^9$ ohm-cm or more, in particular, $3.0 \times 10^{10}$ ohm-cm or more, means that the piezoelectric element has sufficient insulation properties for practical use. The piezoelectric elements of Examples 1 to 10 had a resistivity in a range of $9.0 \times 10^{10}$ to $2.0 \times 10^{12}$ ohm-cm. The elements of Comparative Examples 1 to 3, 6, and 7 had resistivity in a range of $4.0 \times 10^9$ to $1.0 \times 10^{11}$ ohm-cm. The elements of Comparative Examples 4 and 5 had large leak currents and had a resistivity of less than $1 \times 10^5$ ohm-cm.

The changes in relative dielectric constant were measured with changing the temperature of the piezoelectric elements prepared in Examples 1 to 10 and the elements prepared in Comparative Examples 1 to 7, and the Curie temperature of each element was determined as the temperature showing the maximum relative dielectric constant attributed to the phase transition from a tetragonal structure to a cubic structure. The piezoelectric elements of Examples 1 to 10 and the elements of Comparative Examples 1 to 3 and 7 all had high Curie temperatures of 160° C. or more suitable for practical use of the elements, whereas the elements of Comparative Examples 4 and 5 had large leak currents not to specify the Curie temperatures. The element of Comparative Example 6 had a low Curie temperature of 60° C.

Prior to evaluation of the ferroelectric properties and the piezoelectric properties, the piezoelectric elements prepared in Examples 1 to 10 and the elements prepared in Comparative Examples 1 to 7 were polarized. Specifically, a voltage of 5 kV/mm was applied to a sample in an oil bath maintained at 150° C. for 30 minutes, and the sample was then cooled to room temperature while applying the voltage. The elements of Comparative Examples 4 to 6 had large leakage currents at 150° C. and were thereby prevented from polarizing, and therefore the subsequent evaluations of ferroelectricity and piezoelectric properties were not performed.

In order to judge whether the piezoelectric elements prepared in Examples 1 to 10 and the elements prepared in Comparative Examples 1 to 3 and 7 had ferroelectricity in a practical electric field or not, the polarization-electric field hysteresis was measured at room temperature (27° C.). A material showing ferroelectricity in a certain temperature region can also be used in a memory element. Regarding the elements judged to have ferroelectricity, the coercive electric field and the internal electric field were calculated, and the sizes of the fields were compared. Specifically, the polarization quantity when an AC electric field (triangular waves) was applied to the piezoelectric element of the present invention was measured. The AC electric field had a frequency of 10 to 100 Hz, and the maximum intensity of the electric field was ±45 kV/cm. The coercive electric field can be calculated from the electric field intensity (+Ec) at which the spontaneous polarization is reversed from negative to positive and the electric field intensity (−Ec) at which the spontaneous polarization is reversed from positive to negative in a polarization-electric field curve. The internal electric field was calculated as the average of +Ec and −Ec (the amount of shift from the origin in the direction of the electric field axis and is minus when the absolute value of −Ec is large). The piezoelectric elements of Examples 1 to 10 and the elements of Comparative Examples 1 to 3 and 7 had ferroelectricity showing reversion of the spontaneous polarization according to the external electric field. The intensity of the coercive electric field ((the absolute value of +Ec)+(the absolute value of −Ec)/2) had a tendency of increasing with the content of Mg. The internal electric field had a tendency of increasing in the minus direction with the content of Mg. In particular, the piezoelectric elements of Examples 3 to 10 had a coercive electric field of 16.0 kV or more and an internal electric field of −2.0 kV/cm or less.

(Comparison of Piezoelectric Constant and Mechanical Quality Factor)

The piezoelectric constants ($d_{31}$) and the mechanical quality factors ($Q_m$) of the piezoelectric elements prepared in Examples 1 to 10 and the elements prepared in Comparative Examples 1 to 3 and 7 were measured by a resonance-antiresonance method. The results of the measurement are shown in Table 2.

The piezoelectric constant ($d_{33}$) of each sample was measured with a $d_{33}$ meter using the Berlincourt method principle.

TABLE 2

| Sample | Piezoelectric constant $|d_{31}|$ (pm/V) | Mechanical quality factor $Q_m$ |
| --- | --- | --- |
| Example 1 | 55 | 500 |
| Example 2 | 56 | 570 |
| Example 3 | 60 | 560 |
| Example 4 | 60 | 550 |
| Example 5 | 55 | 570 |
| Example 6 | 54 | 570 |
| Example 7 | 57 | 530 |
| Example 8 | 59 | 530 |
| Example 9 | 54 | 520 |
| Example 10 | 51 | 560 |
| Comparative Example 1 | 36 | 230 |
| Comparative Example 2 | 27 | 480 |
| Comparative Example 3 | 10 | 380 |

TABLE 2-continued

| Sample | Piezoelectric constant $|d_{31}|$ (pm/V) | Mechanical quality factor $Q_m$ |
|---|---|---|
| Comparative Example 7 | 20 | 440 |

Every piezoelectric element of Examples 1 to 10 had satisfactory piezoelectric constant ($d_{31}$) and mechanical quality factor (Qm) and had a piezoelectric constant ($d_{33}$) of 150 pC/N or more measured with a $d_{33}$ meter using the Berlincourt method principle.

The piezoelectric elements of Examples 1 to 9, containing Ni and containing Mg in an amount of 0.001 mol or more and 0.020 mol or less based on 1 mol of the metal oxide as the main component, each had a piezoelectric constant ($d_{31}$) of 54 pm/V or more.

The piezoelectric elements of Examples 2 to 8 and 10, each containing Mn and containing Mg in an amount of 0.005 mol or more and 0.020 mol or less based on 1 mol of the metal oxide as the main component, each had a mechanical quality factor of 530 or more.

The piezoelectric material of the element of Comparative Example 1 did not contain Mg and thereby had a low mechanical quality factor, and contained Na in only a small amount and thereby had a small piezoelectric constant ($d_{31}$).

The above-mentioned results demonstrate that the presence of at least one of Mn and Ni and the presence of Mg in a piezoelectric material contribute to compatibility between high piezoelectric properties and high mechanical quality factor Qm.

In contrast, the piezoelectric material of the element of Comparative Example 2 contained an excessive amount of Mg and had a low piezoelectric constant ($d_{31}$).

That is, Comparative Example 2 suggested that even if a piezoelectric material is mainly composed of a component represented by the same compositional formula as $(Na_{0.87}Ba_{0.12})(Nb_{0.88}Ti_{0.12})O_3$ in Example 1 and contains an appropriate amount of a Mn component, an excessive amount of Mg decreases the piezoelectric constant.

The piezoelectric material of the element of Comparative Example 3 did not contain both Ni and Mn and thereby had a low piezoelectric constant ($d_{31}$).

The piezoelectric material of the element of Comparative Example 4 contained an excessive amount of Ni and had a large leakage current, which prevented evaluation of piezoelectric properties.

The piezoelectric material of the element of Comparative Example 5 contained an excessive amount of Mn and had a large leakage current, which prevented evaluation of piezoelectric properties.

The piezoelectric material of the element of Comparative Example 6 had a too small y value (Nb component ratio) and had a low Curie temperature, which prevented evaluation of piezoelectric properties.

The element of Comparative Example 7 had a too large y value (Nb component ratio) and had a small piezoelectric constant ($d_{31}$).

Example 11

Raw materials corresponding to those in Example 3 were weighed as follows.

A raw material powder was prepared as in Example 3 and was wet-mixed using a ball mill for 24 hours for dehydration. A PVB binder was added to this mixed raw material powder, followed by mixing. The mixture was formed into a green sheet having a thickness of 50 μm by a doctor blade method.

A conductive paste for an internal electrode layer was printed on the green sheet. As the conductive paste, an Ag70%-Pd30% (Ag/Pd=2.33) alloy paste was used. Nine green sheets each provided with the conductive paste were stacked to give a layered product. The layered product was fired at 1160° C. for 5 hours to obtain a sintered compact. The sintered compact was cut into a size of 10×2.5 mm. The side faces were then polished, and a pair of external electrodes (a first electrode and a second electrode) for alternately short-circuiting the internal electrode layers was formed by sputtering Au to produce a layered piezoelectric element as shown in FIG. 2B.

Observation of the internal electrode layers of the layered piezoelectric element revealed that Ag—Pd as the electrode material and the piezoelectric material were alternately formed.

Prior to evaluation of piezoelectricity, the layered piezoelectric element sample was polarized. Specifically, the sample was heated to 150° C. in an oil bath, a voltage of 2 kV/mm was applied between the first and the second electrodes for 30 minutes, and the sample was cooled to room temperature while applying the voltage.

Evaluation of the piezoelectricity of the resulting layered piezoelectric element demonstrated that the element had sufficient insulation properties and satisfactory piezoelectric properties equivalent to those of the piezoelectric material of Example 3.

Example 12

A liquid discharge head shown in FIGS. 3A and 3B was produced using the piezoelectric element of Example 3. Discharge of an ink according to input electric signals was confirmed.

Example 13

A liquid discharge device shown in FIG. 4 was produced using the liquid discharge head of Example 12. Discharge of an ink according to input electric signals was confirmed.

Example 14

An ultrasonic motor shown in FIG. 6A was produced using the piezoelectric element of Example 3. Rotation of the motor according to application of an AC voltage was confirmed.

Example 15

An optical apparatus shown in FIGS. 7A and 7B was produced using the ultrasonic motor in Example 14. Autofocus operation according to application of an AC voltage was confirmed.

Example 16

A dust removing device shown in FIGS. 9A and 9B was produced using the piezoelectric element of Example 3. A satisfactory dust removing efficiency for dispersed plastic beads was confirmed by applying an AC voltage.

Example 17

An image pickup device shown in FIG. 12 was produced using the dust removing device of Example 16. In the operation of the device, dust on the surface of the image pickup unit was satisfactorily removed to provide a dust defect-free image.

Example 18

A liquid discharge head shown in FIGS. 3A and 3B was produced using the layered piezoelectric element of Example 11. Discharge of an ink according to input electric signals was confirmed.

Example 19

A liquid discharge device shown in FIG. 4 was produced using the liquid discharge head of Example 18. Discharge of an ink according to input electric signals was confirmed.

Example 20

An ultrasonic motor shown in FIG. 6B was produced using the layered piezoelectric element of Example 11. Rotation of the motor according to application of an AC voltage was confirmed.

Example 21

An optical apparatus shown in FIGS. 7A and 7B was produced using the ultrasonic motor of Example 20. Autofocus operation according to application of an AC voltage was confirmed.

Example 22

A dust removing device shown in FIGS. 9A and 9B was produced using the layered piezoelectric element of Example 11. A satisfactory dust removing efficiency for dispersed plastic beads was confirmed by applying an AC voltage.

Example 23

An image pickup device shown in FIG. 12 was produced using the dust removing device of Example 22. In the operation of the device, dust on the surface of the image pickup unit was satisfactorily removed to provide a dust defect-free image.

Example 24

A piezoelectric acoustic component and an electronic apparatus shown in FIG. 14 were produced using the layered piezoelectric element of Example 11. Loudspeaker operation according to application of an AC voltage was confirmed.

Example 25

A piezoelectric acoustic component and an electronic apparatus shown in FIG. 14 were produced using the piezoelectric element of Example 3. Loudspeaker operation according to application of an AC voltage was confirmed.

The piezoelectric material of the present invention expresses satisfactory piezoelectricity even at high environmental temperature. In addition, since the piezoelectric material does not contain lead, its load on the environment is low. Accordingly, the piezoelectric material of the present invention can be used in various apparatuses including a large amount of the piezoelectric material, such as liquid discharge heads, ultrasonic motors, and dust removing devices, without causing any problem.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A piezoelectric material comprising:
   a perovskite-type metal oxide represented by Formula (1):
   $(Na_xBa_{1-y})(Nb_yTi_{1-y})O_3$, 
   where x is 0.83 or more and 0.95 or less, y is 0.85 or more and 0.95 or less, and x/y is 0.95 or more and 1.05 or less;
   at least one of Mn and Ni; and
   Mg,
   wherein
   the content of Ni is 0.050 mol or less based on 1 mol of the perovskite-type metal oxide,
   the content of Mn is 0.005 mol or less based on 1 mol of the perovskite-type metal oxide; and
   the content of Mg is 0.001 mol or more and 0.020 mol or less based on 1 mol of the perovskite-type metal oxide.

2. The piezoelectric material according to claim 1, wherein the piezoelectric material has crystal grains having an average equivalent circle diameter of 0.5 μm or more and 20 μm or less.

3. A method of producing the piezoelectric material according to claim 1, the method comprising:
   a step of firing a raw material powder at least containing Na, Nb, Ba, Ti, and Mg and containing at least one of Mn and Ni, wherein
   the molar ratio of Na to Nb contained in the raw material powder is 0.95 or more and 1.10 or less.

4. The method according to claim 3, wherein the firing temperature is 1200° C. or less.

5. A piezoelectric element comprising:
   an electrode;
   a piezoelectric material member;
   wherein
   the piezoelectric material member is the piezoelectric material according to claim 1.

6. The piezoelectric element according to claim 5, comprising:
   a plurality of the piezoelectric material members; and
   a plurality of the electrodes,
   wherein
   the piezoelectric material members and the electrodes are alternately stacked.

7. The piezoelectric element according to claim 6, wherein
   the electrode contains Ag and Pd at a weight ratio of Ag to Pd is 1.5 or more and 9.0 or less.

8. The piezoelectric element according to claim 6, wherein
   the electrode contains at least one of Ni and Cu.

9. A liquid discharge head comprising:
   a liquid chamber including a vibratory unit including the piezoelectric element according to claim 5; and
   a discharge port communicating with the liquid chamber.

10. A liquid discharge device comprising:
    a transfer object-holding unit; and
    the liquid discharge head according to claim 9.

11. An ultrasonic motor comprising:
a vibratory component including the piezoelectric element according to claim 5; and
a movable component being in contact with the vibratory component.

12. An optical apparatus comprising:
a driving unit including the ultrasonic motor according to claim 11.

13. A vibratory device comprising:
a vibratory component including a diaphragm provided with the piezoelectric element according to claim 5.

14. A dust removing device comprising:
a vibratory unit including the vibratory device according to claim 13.

15. An image pickup device at least comprising:
the dust removing device according to claim 14; and
an image pickup element unit, wherein
the dust removing device has a diaphragm on the light-receiving surface side of the image pickup element unit.

16. A piezoelectric acoustic component comprising:
the piezoelectric element according to claim 5; and
an electric circuit.

17. An electronic apparatus comprising:
the piezoelectric element according to claim 5; and
an electric circuit.

* * * * *